(12) United States Patent
Nieh et al.

(10) Patent No.: US 11,114,339 B2
(45) Date of Patent: Sep. 7, 2021

(54) METHOD FOR REDUCING METAL PLUG CORROSION AND DEVICE

(71) Applicant: Taiwan Semiconductor Manufacturing Company, Ltd., Hsinchu (TW)

(72) Inventors: Ling-Fu Nieh, Taipei (TW); Chun-Wei Hsu, Hsinchu (TW); Pinlei Edmund Chu, Hsinchu (TW); Chi-Jen Liu, Taipei (TW); Liang-Guang Chen, Hsinchu (TW); Yi-Sheng Lin, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/686,682

(22) Filed: Nov. 18, 2019

(65) Prior Publication Data
US 2020/0090997 A1 Mar. 19, 2020

Related U.S. Application Data

(63) Continuation of application No. 16/114,932, filed on Aug. 28, 2018, now Pat. No. 10,510,601.
(Continued)

(51) Int. Cl.
| *H01L 21/768* | (2006.01) |
| *H01L 29/78* | (2006.01) |
| *H01L 21/321* | (2006.01) |
| *H01L 21/8238* | (2006.01) |
| *H01L 23/485* | (2006.01) |
| *H01L 29/08* | (2006.01) |

(Continued)

(52) U.S. Cl.
CPC ......... *H01L 21/76897* (2013.01); *C09G 1/02* (2013.01); *H01L 21/02074* (2013.01); *H01L 21/3212* (2013.01); *H01L 21/7684* (2013.01); *H01L 21/76843* (2013.01); *H01L 21/823814* (2013.01); *H01L 21/823821* (2013.01); *H01L 21/823871* (2013.01); *H01L 23/485* (2013.01); *H01L 29/0847* (2013.01); *H01L 29/41766* (2013.01); *H01L 29/78* (2013.01); *H01L 29/7851* (2013.01); *H01L 21/823475* (2013.01); *H01L 2029/7858* (2013.01)

(58) Field of Classification Search
CPC ................ H01L 21/7684; H01L 21/02074
See application file for complete search history.

(56) References Cited

U.S. PATENT DOCUMENTS

| 2002/0004360 A1 | 1/2002 | Ota et al. |
| 2003/0119324 A1 | 6/2003 | Jung et al. |

(Continued)

*Primary Examiner* — Farun Lu
(74) *Attorney, Agent, or Firm* — Slater Matsil, LLP

(57) ABSTRACT

A method of manufacturing a device includes exposing at least one of a source/drain contact plug or a gate contact plug to a metal ion source solution during a manufacturing process, wherein a constituent metal of a metal ion in the metal ion source solution and the at least one source/drain contact plug or gate contact plug is the same. If the source/drain contact plug or the gate contact plug is formed of cobalt, the metal ion source solution includes a cobalt ion source solution. If the source/drain contact plug or the gate contact plug is formed of tungsten, the metal ion source solution includes a tungsten ion source solution.

20 Claims, 26 Drawing Sheets

Related U.S. Application Data

(60) Provisional application No. 62/564,769, filed on Sep. 28, 2017.

(51) Int. Cl.
*C09G 1/02* (2006.01)
*H01L 21/02* (2006.01)
*H01L 29/417* (2006.01)
*H01L 21/8234* (2006.01)

(56) References Cited

U.S. PATENT DOCUMENTS

2008/0190894 A1* 8/2008 Yu ............................ C09G 1/02
216/83
2016/0020148 A1* 1/2016 Song ................ H01L 21/76843
438/238
2017/0092726 A1 3/2017 Nidhi et al.

* cited by examiner

METHOD FOR REDUCING METAL PLUG CORROSION AND DEVICE

PRIORITY CLAIM AND CROSS-REFERENCE

This application is a continuation of U.S. patent application Ser. No. 16/114,932, filed Aug. 28, 2018, which application claims the benefit of U.S. Provisional Application No. 62/564,769, filed on Sep. 28, 2017, entitled "Method for Reducing Metal Plug Corrosion and Device," which applications are incorporated herein by reference.

BACKGROUND

Metal-Oxide-Semiconductor (MOS) devices are basic building elements in integrated circuits. An existing MOS device typically has a gate and source/drain, which can be contacted with metal contact plugs that extend through dielectric layers.

Metal contact plugs are fabricated through the deposition of metal-containing materials into openings in the dielectric layers and are typically planarized using Chemical Mechanical Polishing ("CMP") and other subsequent fine polishing steps.

The metal contact plugs can be subject to corrosion during the planarization and fine polishing steps.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
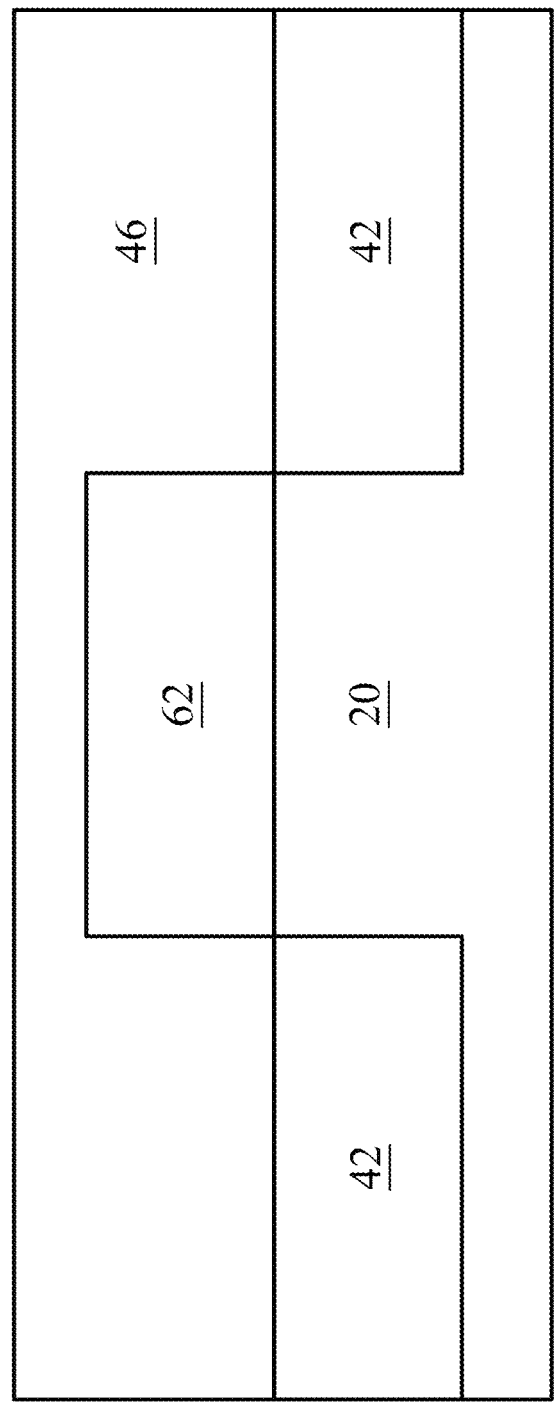
FIGS. 1-11 and 25 are cross-sectional views of gate and source/drain contact plugs associated with a transistor, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor and the methods of forming the same are provided in accordance with various exemplary embodiments. The intermediate stages of forming the transistors are illustrated in accordance with some embodiments. Some variations of some embodiments are discussed. Throughout the various views and illustrative embodiments, like reference numbers are used to designate like elements. In the illustrated exemplary embodiments, the formation of Fin Field-Effect Transistor (FinFETs) is used as an example to explain the concepts of the present disclosure. Planar transistors may also adopt the concept of the present disclosure.

Plug corrosion and/or recesses in contact plugs can occur during a CMP operation. The plug corrosion problem is exacerbated as integrated circuit feature sizes continue to shrink. The problem of plug corrosion is even more pronounced in isolated plug areas than in dense plug regions. The problem of plug corrosion is still further exacerbated if reactive metals are used during integrated circuit processing that can interact with the metal contact plugs. Adding metal ions during a CMP or polishing rinse of the same metal type as the metal contact plug according to some embodiments substantially solves the above described contact plug corrosion and recession problems, even with diminishing feature sizes down to 16 nm or even smaller.

FIGS. 1 through 22 illustrate cross-sectional views in the formation of transistors in accordance with some embodiments of the present disclosure. The steps shown in FIGS. 1 through 22 are also reflected schematically in the process flows shown in FIGS. 23 and 24.

FIGS. 1 through 6 illustrate the formation of lower source/drain contact plugs for a transistor, according to an embodiment. The transistor could be a planar transistor or a FinFET, in embodiments.

FIG. 1 illustrates a cross-sectional view of an initial structure, which may comprise a transistor in an embodiment. The initial structure includes wafer 10, which further includes substrate 20. Substrate 20 may be a semiconductor substrate, which may be a silicon substrate, a silicon germanium substrate, or a substrate formed of other semiconductor materials. Substrate 20 may be doped with a p-type or an n-type impurity. A metal-containing material 62 forms part of a generalized gate structure, which includes an oxide region and other regions (not shown). It is important to note that the metal used in the gate structure, in the gate contact plugs, and in the source/drain contact plugs can and often do use different materials. In accordance with some embodiments, layer 62 comprises a metal layer and can include tungsten (W), aluminum (Al), titanium (Ti), titanium nitride (TiN), tantalum (Ta), tantalum nitride (TaN), cobalt (Co), copper (Cu), nickel (Ni), combinations thereof, and/or other suitable materials. After etching and epitaxial growth, epitaxy regions 42 may be further implanted with a p-type or an n-type impurity to form source and drain regions, which are also denoted using reference numeral 42. The initial structure also includes an Inter-Layer Dielectric (ILD) 46 formed over the source/drain regions 42. While the ILD layer 46 is shown as continuous, the portion above the gate region 62 may include hard mask regions and sacrificial layers and other related structures (not shown). ILD 46 may include a dielectric material formed using, for example, FCVD, spin-on coating, CVD, or other deposition methods. ILD 46 may also be formed of Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

Figure 2:
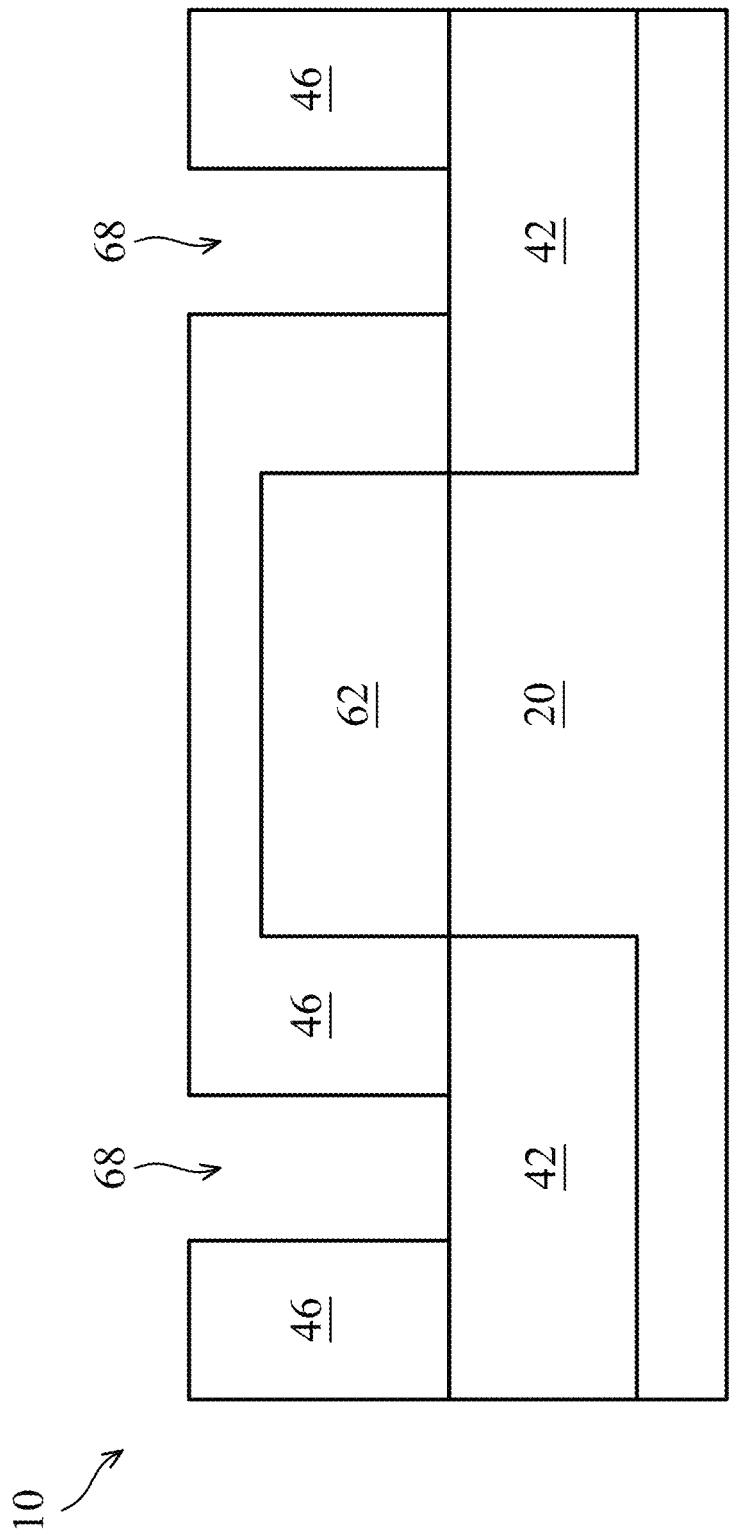

Referring to FIG. 2, ILD layer 46 is etched to form contact openings 68. The respective step is illustrated as step 214 in the process flow shown in FIG. 24.

Figure 3:
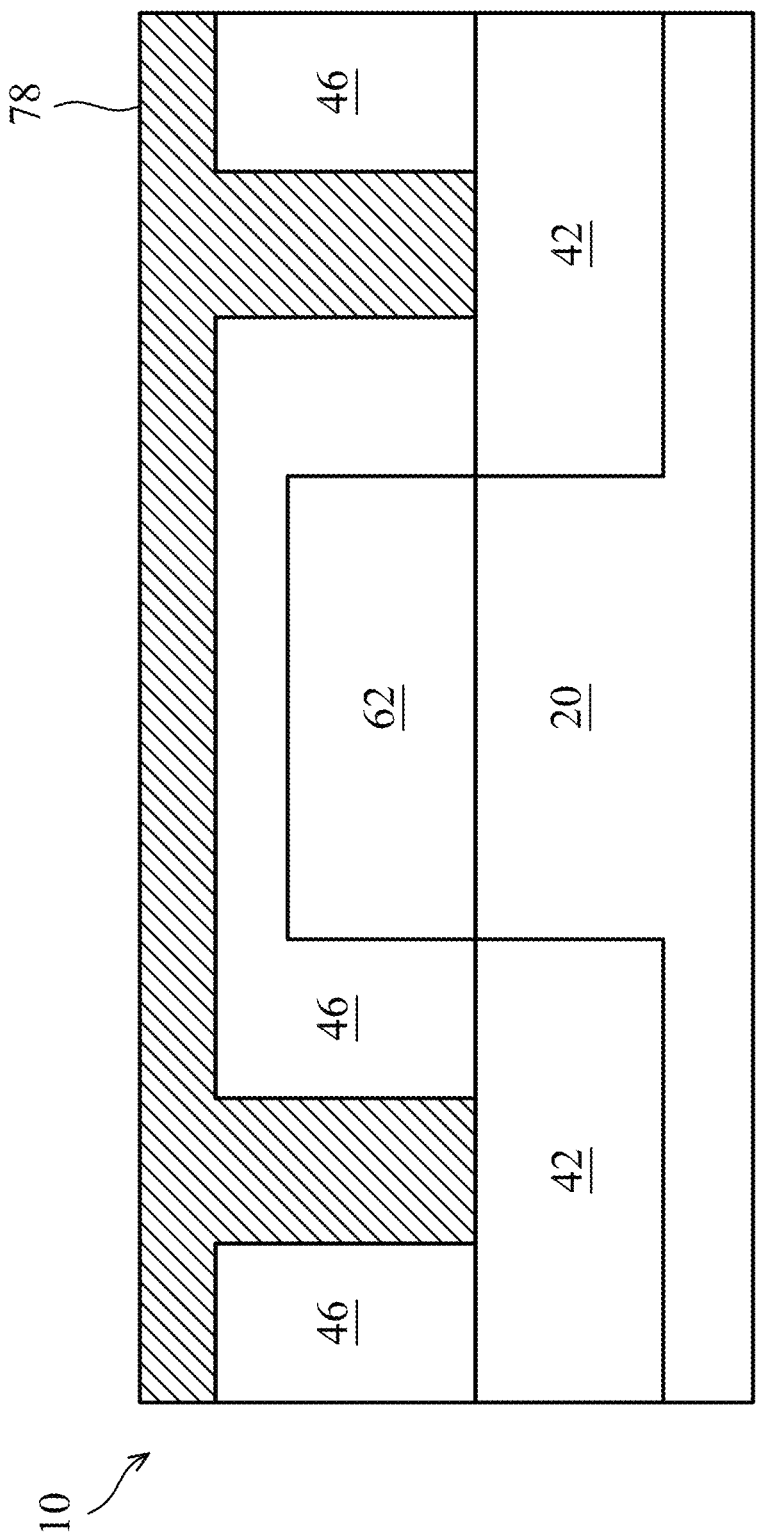

Next, as shown in FIG. 3, metal-containing layer 78 is deposited over and in contact with source/drain regions 42. The respective step is illustrated as step 220 in the process flow shown in FIG. 24. Metal-containing layer 78 may be formed of the same material as or a different material from metal-containing material 62 as mentioned above. Furthermore, the formation method, the material, and the structure of metal-containing layer 78 may also be selected from the candidate formation methods, the candidate materials, and the candidate structures of metal-containing material 62. For example, metal-containing layer 78 may be a homogenous metal layer such as a cobalt or tungsten layer.

Figure 4:
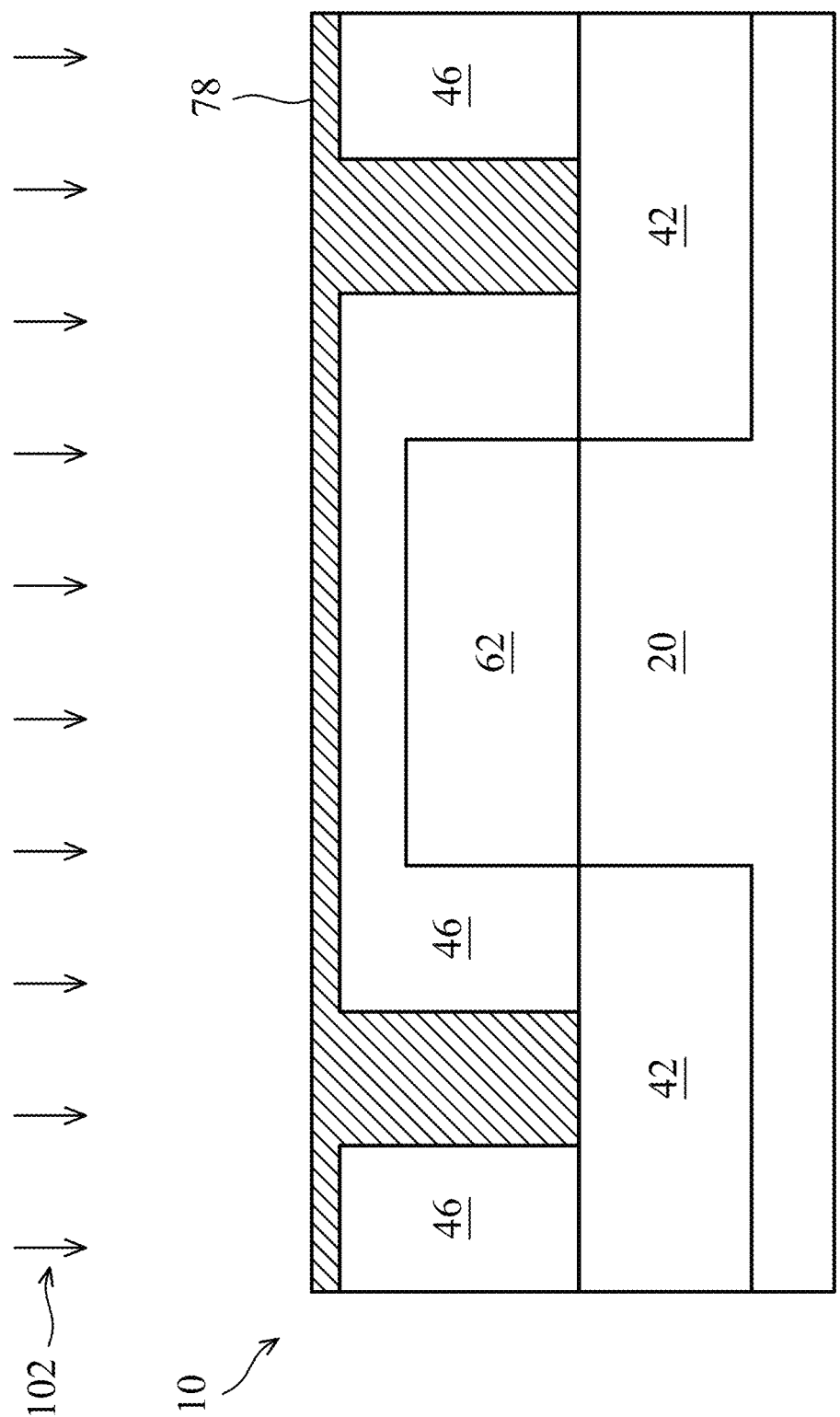

Referring to FIG. 4, a planarization 102 such as a CMP is then performed to remove the portions of layers 78 over ILD layer 46. The top portion of layer 78 is shown as partially removed in FIG. 4. Removal of layer 78 continues until the entire top portion of layer 78 is removed (best viewed in FIG. 5), and can also include further removal of material below a top surface of ILD layer 46. The respective step is illustrated as step 222 in the process flow shown in FIG. 24.

Planarization 102 uses a slurry for the relatively coarse removal of the ILD layer 46 and the metal layer 78 shown in FIG. 4. The slurry includes a metal ion source compound corresponding to the metal used in metal layer 78. For example, in embodiments in which the metal-containing layer 78 comprises cobalt or tungsten, cobalt or tungsten metal ion source compounds are used in the slurry that correspond to the cobalt or tungsten metal used in metal layer 78.

If cobalt is used for metal-containing layer 78, the CMP slurry used is a solution including at least one cobalt ion source compound. In an embodiment, the cobalt ion source compound is one or more of cobalt acetate ($Co(OAc)_2$), cobalt hydroxide ($Co(OH)_2$), cobalt chloride ($CoCl_2$), or hexamine cobalt chloride ($[Co(NH_3)_6]Cl_3$). Other such cobalt-containing compounds can also be used as the cobalt ion source for the slurry. In an embodiment, the makeup of the CMP slurry may also include a combination of chemical reactants and abrasives in order to help remove and planarize layers of a semiconductor structure (such as that shown in FIG. 4). For example, the makeup of the CMP slurry may contain chemical reactants (e.g., potassium hydroxide (KOH)) and other chemicals such as mineral acids, organic acids, strong bases, mineral salts, organic salts, pH buffers, oxidizing agents, organic and inorganic peroxides, corrosion inhibitors, chelating agents, liquid polymers, surfactants, stabilizers, solvents (e.g., water), combinations of these, or the like, depending on the precise makeup of the layer which it is desired to be removed and planarized. Additionally, the makeup CMP slurry may also contain an abrasive, such as silica ($SiO_2$), alumina, ceria, titanium oxide, zirconia, combinations of these, or the like, in a concentration of between about 10% by volume and about 25% by volume, such as about 25% by volume. In an embodiment, the abrasives may have a particle size of between about 20 nm and about 1000 nm, such as about 343 nm.

If tungsten is used for metal-containing layer 78, the slurry used is a solution including at least one tungsten ion source compound. In an embodiment, the tungsten ion source compound is one or more of tungsten chloride ($WCl_4$), tungsten hexachloride ($WCl_6$), tungstic acid ($H_2WO_4$), or tungsten oxychloride ($WOCl_4$). Other such tungsten-containing compounds can also be used as the tungsten ion source for the rinse. In an embodiment, the makeup of the CMP slurry may also include a combination of chemical reactants and abrasives in order to help remove and planarize layers of a semiconductor structure (such as that shown in FIG. 4) substantially as discussed above.

The concentration of the ion source compound in the slurry for both embodiments (Co and W) is 10 ppm to a fully saturated concentration. The resultant solution will be acidic, with a pH value between two and four for Tungsten, and greater than nine for cobalt. Herein, the "fully saturated" term applies to the dissociated ion concentration. The choice of the ion source compound used will affect corrosion inhibition performance. An example ion source compound for tungsten is $K_2WO_4$ and an example ion source compound for cobalt is $CoCO_3$.

CMP slurry process conditions include a processing temperature of about 40° C. with a range of about 25° C. to 80° C. A slurry flow rate is about 0.018 cubic meters per hour (CMH) with a range of about 0.006 to 0.03 CMH. A CMP pad pressure is about 2 psi with a range of about 0.5 psi to 4 psi.

In an embodiment, a lower concentration of the inhibitor materials typically used in a CMP slurry can be used if an ion source compound is present. For example, the concentration of a corrosion inhibitor in a slurry with no metal ion source compound can be reduced by a factor of five if a fully saturated concentration of a metal ion source compound is used in the slurry in some embodiments. The concentration of the corrosion inhibitor is thus inversely proportional to the concentration of the metal ion source compound in the slurry. The reduction of concentration of the corrosion inhibitor in the slurry depends on compositions of the slurry and the composition of the surface to be polished.

For example, in an embodiment, a first example slurry can have ten times of a nominal concentration of a corrosion inhibitor, and zero nominal concentration of a metal ion source compound. A second example slurry can have five times of a nominal concentration of a corrosion inhibitor, and five times a concentration of a metal ion source compound. A third example slurry can have two times of a nominal concentration of a corrosion inhibitor, and a saturated concentration of a metal ion source compound.

Figure 5:
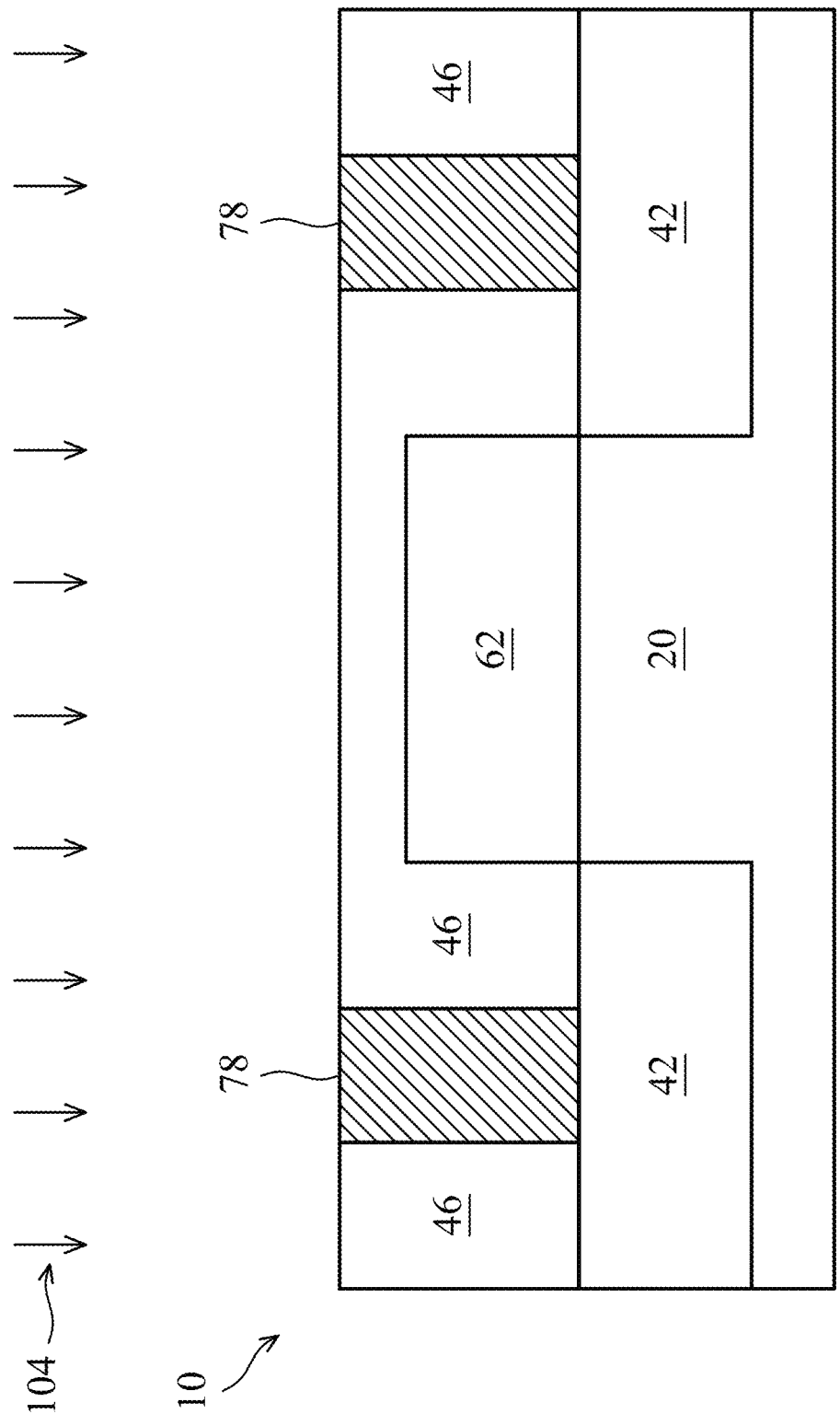

Polishing 104 uses a rinse in conjunction with the relatively fine removal and polishing of the top surface of layers 46 and 78 shown in FIG. 5. The rinse includes a metal ion source compound corresponding to the metal used in metal layer 78. For example, in embodiments, cobalt or tungsten metal ion source compounds are used in the rinse that correspond to the cobalt or tungsten metal used in metal layer 78.

If cobalt is used for metal-containing layer 78, the rinse used is a solution including at least one cobalt ion source compound. The other constituents of the cobalt rinse solution are typically an abrasive compound, a chelator, and a corrosion inhibitor such as benzotriazole (BTA). In an embodiment, the cobalt ion source compound is one or more of cobalt acetate (Co(OAc)2), cobalt hydroxide ($Co(OH)_2$), cobalt chloride ($CoCl_2$), or hexamine cobalt chloride ($[Co(NH_3)_6]Cl_3$). Other such cobalt-containing compounds can also be used as the cobalt ion source for the rinse.

If tungsten is used for metal-containing layer 78, the rinse used is a solution including at least one tungsten ion source compound. The other constituents of the tungsten rinse solution are typically an abrasive compound, a chelator, and a corrosion inhibitor such as an amino acid. In an embodiment, the tungsten ion source compound is one or more of tungsten chloride (WCl4), tungsten hexachloride ($WCl_6$), tungstic acid ($H_2WO_4$), or tungsten oxychloride ($WOCl_4$). Other such tungsten-containing compounds can also be used as the tungsten ion source for the rinse.

The concentration of the ion source compound in the rinse for both embodiments (Co and W) is 10 ppm to a fully saturated concentration. The resultant solution will be acidic, with a pH value between two and four for Tungsten, or basic, with a pH value greater than nine for cobalt.

Fine polishing process conditions include a processing temperature of about 40° C. with a range of about 25° C. to 80° C. A rinse flow rate is about 0.018 cubic meters per hour (CMH) with a range of about 0.006 to 0.03 CMH. A polishing pad pressure is about 2 psi with a range of about 0.5 psi to 4 psi.

In an embodiment, a lower concentration of the inhibitor materials typically used in a polishing rinse can be used if an ion source compound is present. For example, the concentration of a corrosion inhibitor in a rinse with no metal ion source compound can be reduced by a factor of five if a fully saturated concentration of a metal ion source compound is used in the rinse in some embodiments. The concentration of the corrosion inhibitor is thus inversely proportional to the concentration of the metal ion source compound in the rinse. The reduction of concentration of the corrosion inhibitor in the rinse depends on compositions of the rinse and the composition of the surface to be rinsed.

For example, in an embodiment, a first example rinse can have ten times of a nominal concentration of a corrosion inhibitor, and zero nominal concentration of a metal ion source compound. A second example rinse can have five times of a nominal concentration of a corrosion inhibitor, and five times a concentration of a metal ion source compound. A third example rinse can have two times of a nominal concentration of a corrosion inhibitor, and a saturated concentration of a metal ion source compound.

Polishing 104 is typically a fine polishing step and a following water rinse step, including transfer steps such as transferring between polishing units, transferring from polishing units to clean units, and transferring between clean units.

Figure 6:
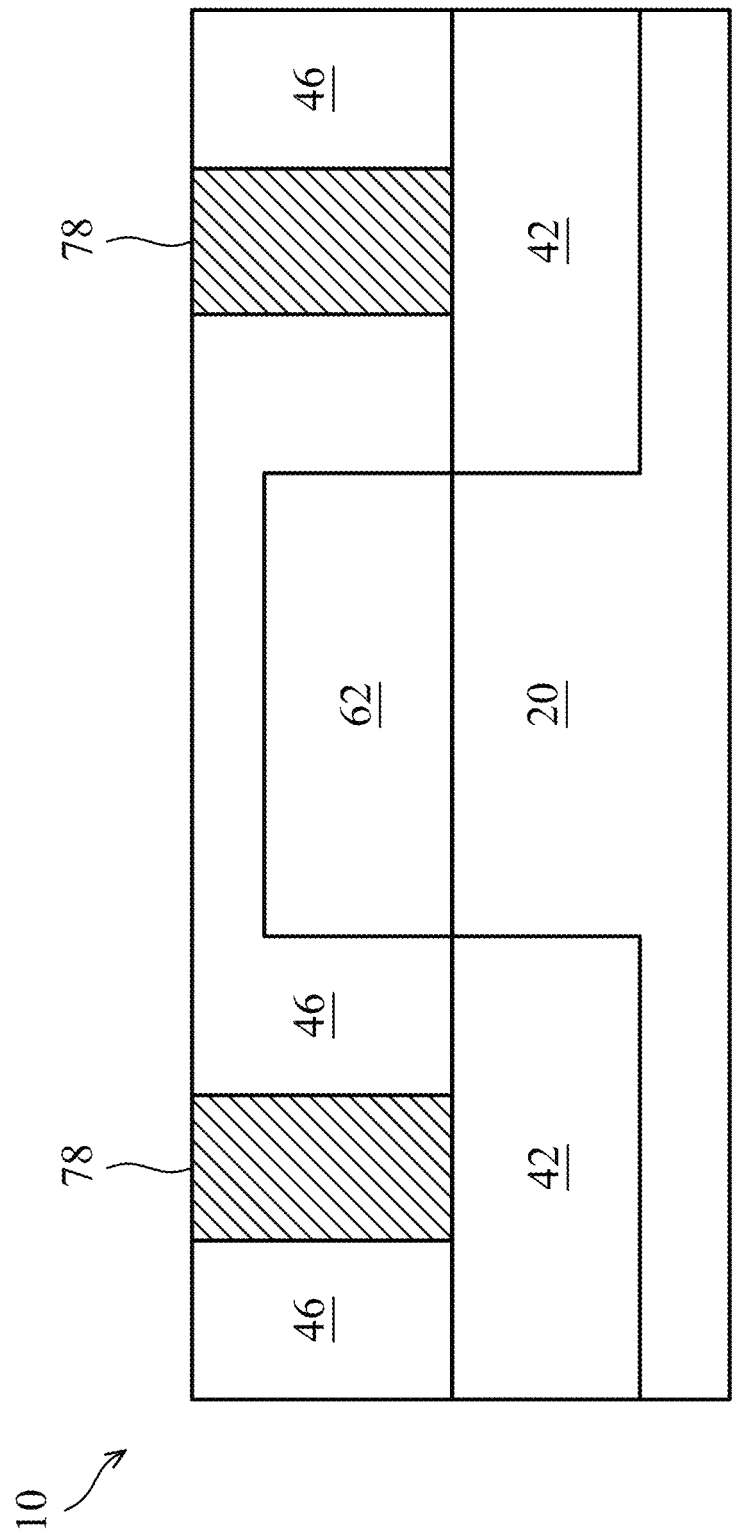

The resulting intermediate structure is shown in FIG. 6, which illustrates source/drain contact plugs 78.

FIGS. 7 through 11 illustrate the formation of a gate contact plug according to an embodiment. The respective step is illustrated as step 224 in the process flow shown in FIG. 24. While FIGS. 7 through 11 illustrate the formation of the gate contact plug after the formation of the source/drain contact plugs, the gate contact plug can be formed simultaneously with the formation of the source/drain contact plugs, or even before the formation of the source/drain contact plugs, in embodiments.

Figure 7:
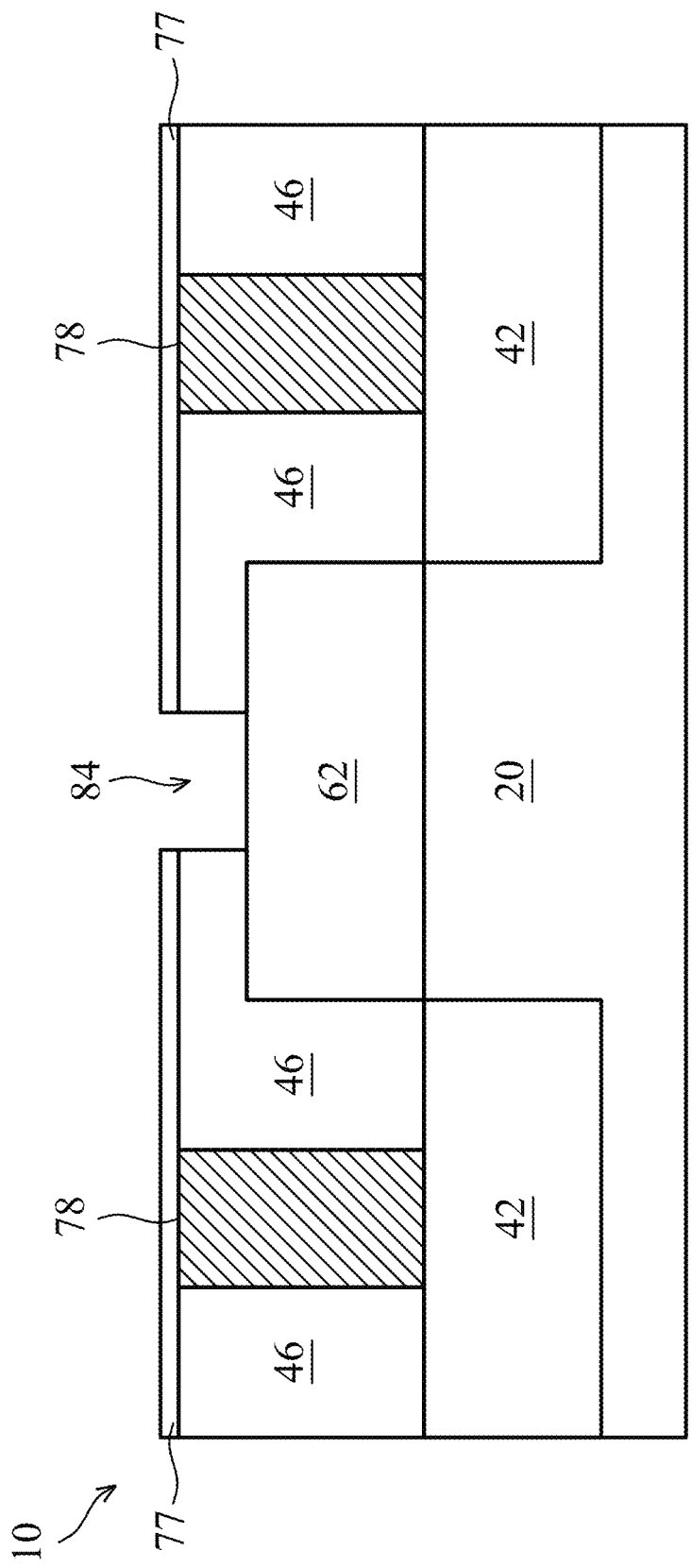

Referring to FIG. 7, a photolithography process is performed using a lithography mask (not shown) to etch-through dielectric layer 46, forming an opening 80. In accordance with some embodiments of the present disclosure, the formation of opening 80 includes an anisotropic etching to etch-through dielectric layer 46, and an isotropic etching (wet) or an anisotropic etch (dry) to remove a hard mask (not shown). A patterned etch stop layer 77 can also be used as a mask as well as to prevent the metal of a metal-containing material layer 84 from mixing with the metal of the source/drain contact plugs 78.

Figure 8:
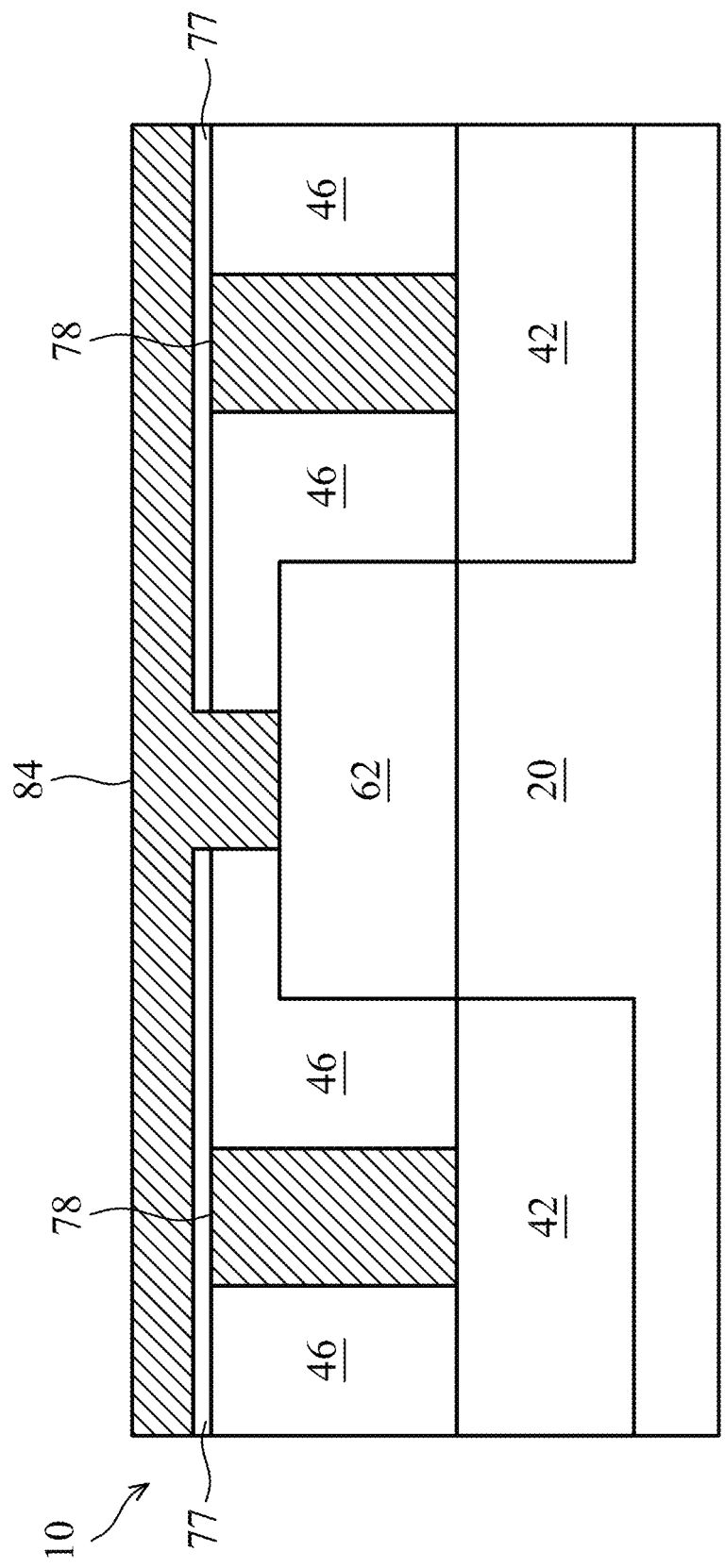

Referring to FIG. 8, the metal-containing material 84 is deposited. As previously described is important to note that the metal used in the gate structure (metal-containing material 62), in the gate contact plugs (metal-containing material 84), and in the source/drain contact plugs 78 can and often do use different materials. The material, the structure, and the formation method of metal-containing material 84 may be selected from the candidate materials, the candidate structures, and the candidate formation methods, respectively, of metal-containing material 62, and hence the details are not repeated herein, and may be found referring to the discussion of metal-containing material 62. Accordingly, similar to metal-containing material 62, metal-containing material 84 may also be formed of cobalt, tungsten, or composite layers thereof. In a subsequent step, a planarization such as a CMP is performed as is explained in further detail below.

Figure 9:
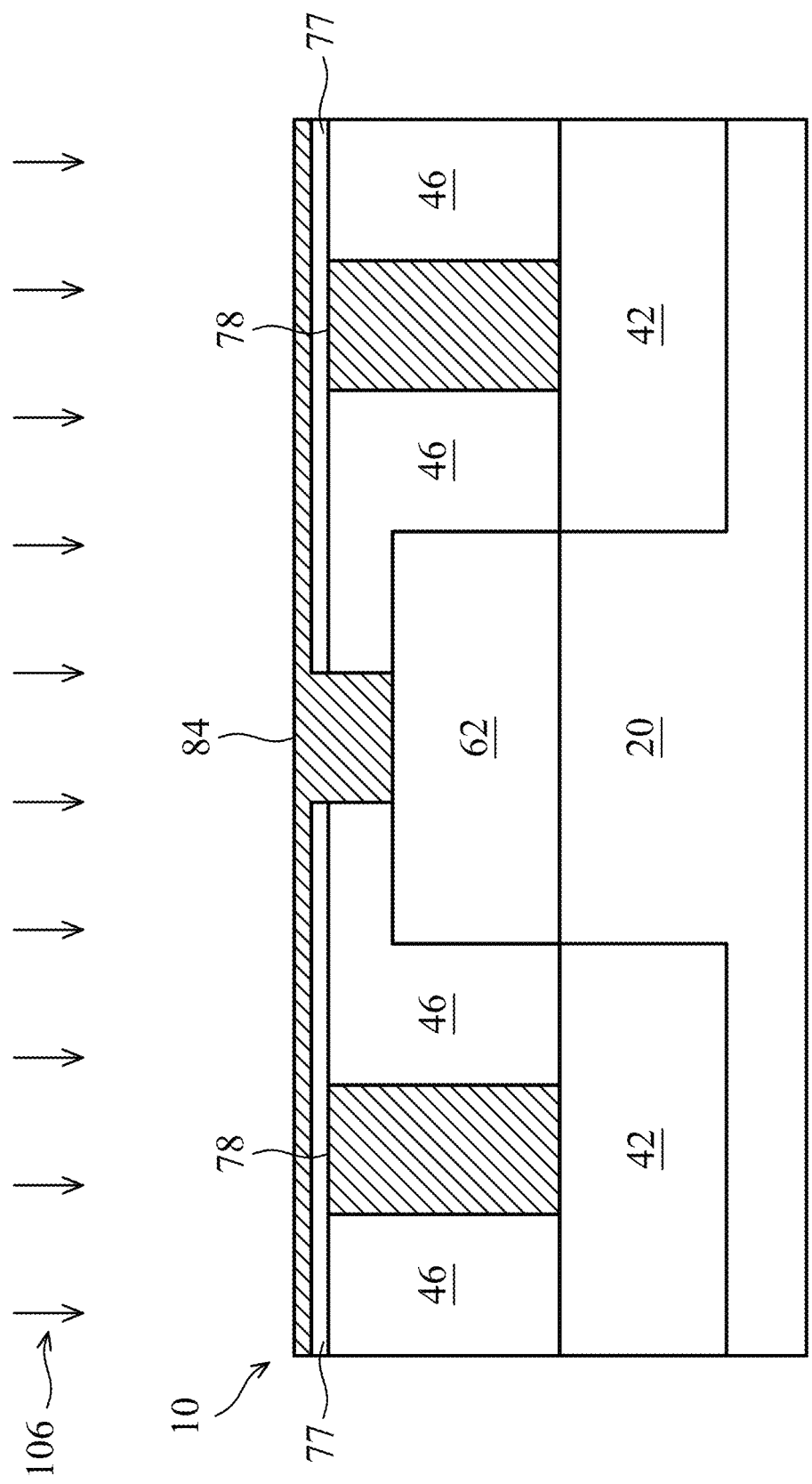
Figure 10:
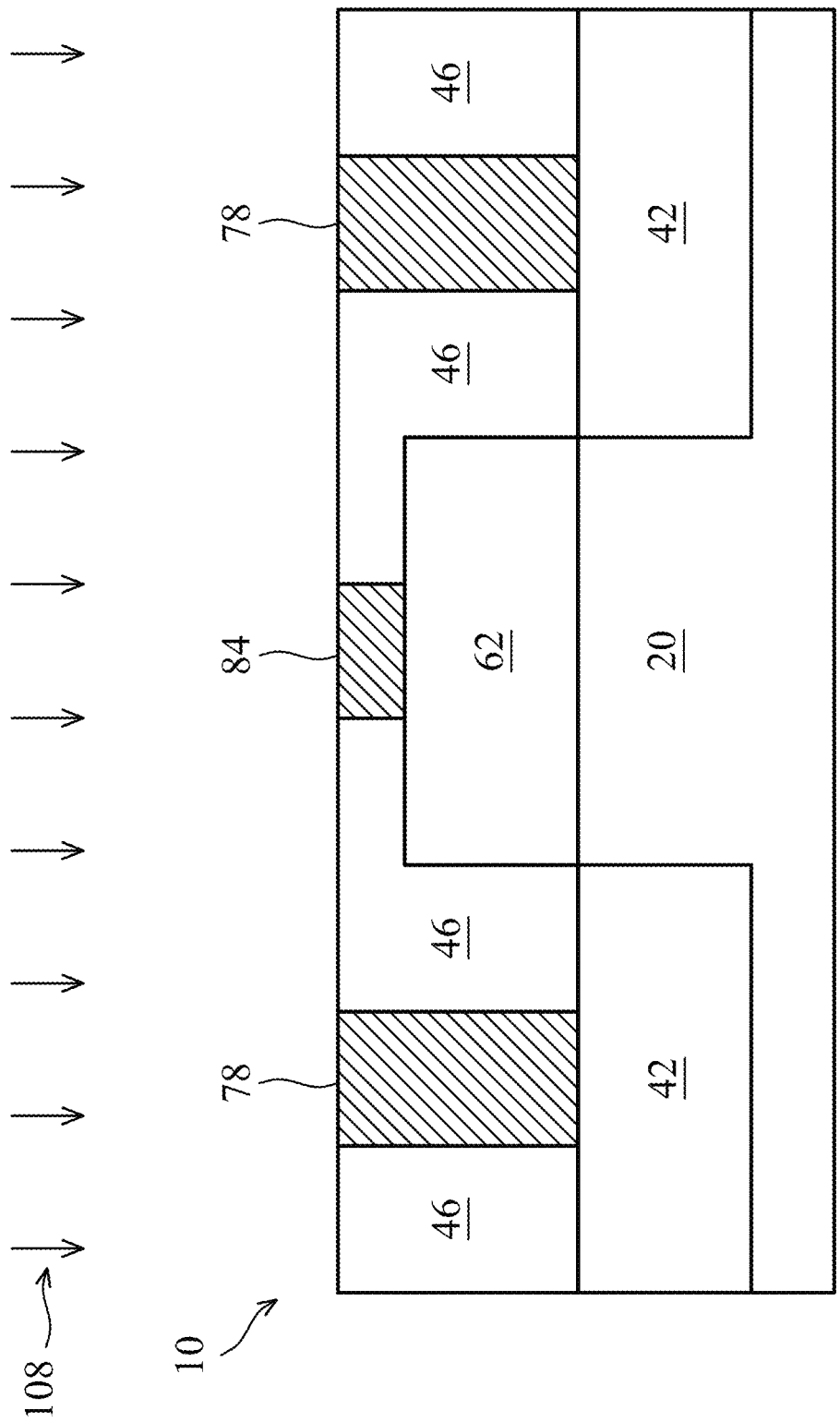

Referring to FIG. 9, a planarization 106 such as a CMP is then performed to remove the portions of layers 84 over ILD layer 46. The top portion of layer 84 is shown as partially removed in FIG. 9. Removal of layer 84 continues until the entire top portion of layer 84 is removed (best seen in FIG. 10), and can also include further removal of material below a top surface of ILD layer 46. FIG. 10 also shows that the etch stop layer 77 has been removed during planarization. The respective step is illustrated as part of step 224 in the process flow shown in FIG. 24.

Planarization 106 also uses a slurry for the relatively coarse removal of the ILD layer 46 and the metal layer 84 shown in FIG. 9.

If cobalt is used for metal-containing layer 84, the slurry used is a solution including at least one cobalt ion source compound. In an embodiment, the cobalt ion source compound is one or more of cobalt acetate ($Co(OAc)_2$), cobalt hydroxide ($Co(OH)_2$), cobalt chloride ($CoCl_2$), or hexamine cobalt chloride ($[Co(NH_3)_6]Cl_3$). Other such cobalt-containing compounds can also be used as the cobalt ion source for the slurry. In an embodiment, the makeup of the CMP slurry may also include a combination of chemical reactants and abrasives in order to help remove and planarize layers of a semiconductor structure (such as that shown in FIG. 9) substantially as discussed above.

If tungsten is used for metal-containing layer 84, the slurry used is a solution including at least one tungsten ion source compound. In an embodiment, the tungsten ion source compound is one or more of tungsten chloride ($WCl_4$), tungsten hexachloride ($WCl_6$), tungstic acid ($H_2WO_4$), or tungsten oxychloride ($WOCl_4$). Other such tungsten-containing compounds can also be used as the tungsten ion source for the slurry. In an embodiment, the makeup of the CMP slurry may also include a combination of chemical reactants and abrasives in order to help remove and planarize layers of a semiconductor structure (such as that shown in FIG. 9) substantially as discussed above.

The concentration of the ion source compound in the slurry for both embodiments (Co and W) is 10 ppm to a fully saturated concentration. The resultant solution will be acidic, with a pH value between two and four for Tungsten, or basic, with a pH value greater than nine for cobalt.

CMP slurry process conditions include a processing temperature of about 40° C. with a range of about 25° C. to 80° C. A slurry flow rate is about 0.018 cubic meters per hour (CMH) with a range of about 0.006 to 0.03 CMH. A CMP pad pressure is about 2 psi with a range of about 0.5 psi to 4 psi.

In an embodiment, a lower concentration of the inhibitor materials typically used in a CMP slurry can be used if an ion source compound is present. For example, the concentration of a corrosion inhibitor in a slurry with no metal ion source compound can be reduced by a factor of five if a fully saturated concentration of a metal ion source compound is used in the slurry in some embodiments. The concentration of the corrosion inhibitor is thus inversely proportional to the concentration of the metal ion source compound in the slurry. The reduction of concentration of the corrosion inhibitor in the slurry depends on compositions of the slurry and the composition of the surface to be polished.

For example, in an embodiment, a first example slurry can have ten times of a nominal concentration of a corrosion inhibitor, and zero nominal concentration of a metal ion source compound. A second example slurry can have five times of a nominal concentration of a corrosion inhibitor, and five times a concentration of a metal ion source compound. A third example slurry can have two times of a nominal concentration of a corrosion inhibitor, and a saturated concentration of a metal ion source compound.

Polishing 108 uses a rinse in conjunction with the relatively fine removal and polishing of the top surface of layers 46 and 84 shown in FIG. 10, including transfer steps such as transferring between polishing units, transferring from polishing units to clean units, and transferring between clean units.

If cobalt is used for metal-containing layer 84, the rinse used is a solution including at least one cobalt ion source compound. The other constituents of the cobalt rinse solution are an abrasive compound, a chelator, and a corrosion inhibitor such as BTA. In an embodiment, the cobalt ion source compound is one or more of cobalt acetate (Co(OAc)2), cobalt hydroxide (Co(OH)2), cobalt chloride ($CoCl_2$), or hexamine cobalt chloride ($[Co(NH3)_6]Cl_3$). Other such cobalt-containing compounds can also be used as the cobalt ion source for the rinse.

If tungsten is used for metal-containing layer 84, the rinse used is a solution including at least one tungsten ion source compound. The other constituents of the tungsten rinse solution are an abrasive compound, a chelator, and a corrosion inhibitor such as an amino acid. In an embodiment, the tungsten ion source compound is one or more of tungsten chloride (WCl4), tungsten hexachloride ($WCl_6$), tungstic acid ($H_2WO_4$), or tungsten oxychloride ($WOCl_4$). Other such tungsten-containing compounds can also be used as the tungsten ion source for the rinse.

The concentration of the ion source compound in the rinse for both embodiments (Co and W) is 10 ppm to a fully saturated concentration. The resultant solution will be acidic, with a pH value between two and four for Tungsten, and greater than nine for cobalt.

Fine polishing process conditions include a processing temperature of about 40° C. with a range of about 25° C. to 80° C. A rinse flow rate is about 0.018 cubic meters per hour (CMH) with a range of about 0.006 to 0.03 CMH. A polishing pad pressure is about 2 psi with a range of about 0.5 psi to 4 psi.

In an embodiment, a lower concentration of the inhibitor materials typically used in a polishing rinse can be used if an ion source compound is present. For example, the concentration of a corrosion inhibitor in a rinse with no metal ion source compound can be reduced by a factor of five if a fully saturated concentration of a metal ion source compound is used in the rinse in some embodiments. The concentration of the corrosion inhibitor is thus inversely proportional to the concentration of the metal ion source compound in the rinse. The reduction of concentration of the corrosion inhibitor in the rinse depends on compositions of the rinse and the composition of the surface to be rinsed.

For example, in an embodiment, a first example rinse can have ten times of a nominal concentration of a corrosion inhibitor, and zero nominal concentration of a metal ion source compound. A second example rinse can have five times of a nominal concentration of a corrosion inhibitor, and five times a concentration of a metal ion source compound. A third example rinse can have two times of a nominal concentration of a corrosion inhibitor, and a saturated concentration of a metal ion source compound.

Polishing 108 is typically a fine polishing step and a following water rinse step, including transfer steps such as transferring between polishing units, transferring from polishing units to clean units, and transferring between clean units.

Figure 11:
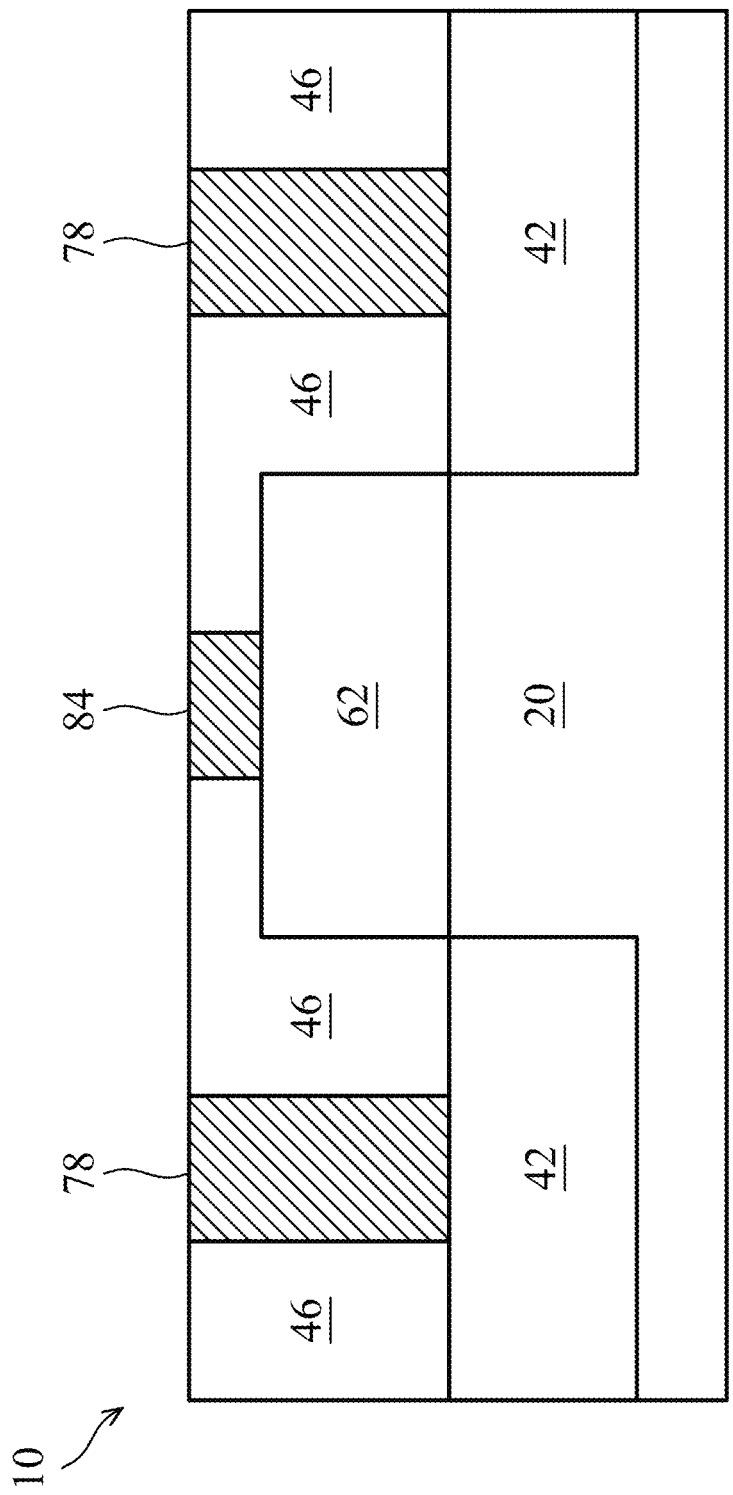

The resulting intermediate structure is shown in FIG. 11, which illustrates the gate contact plug 84.

FIGS. 12 through 22 illustrate the formation of lower source/drain contact plugs for a transistor, such as a FinFET, according to an embodiment.

Figure 12:
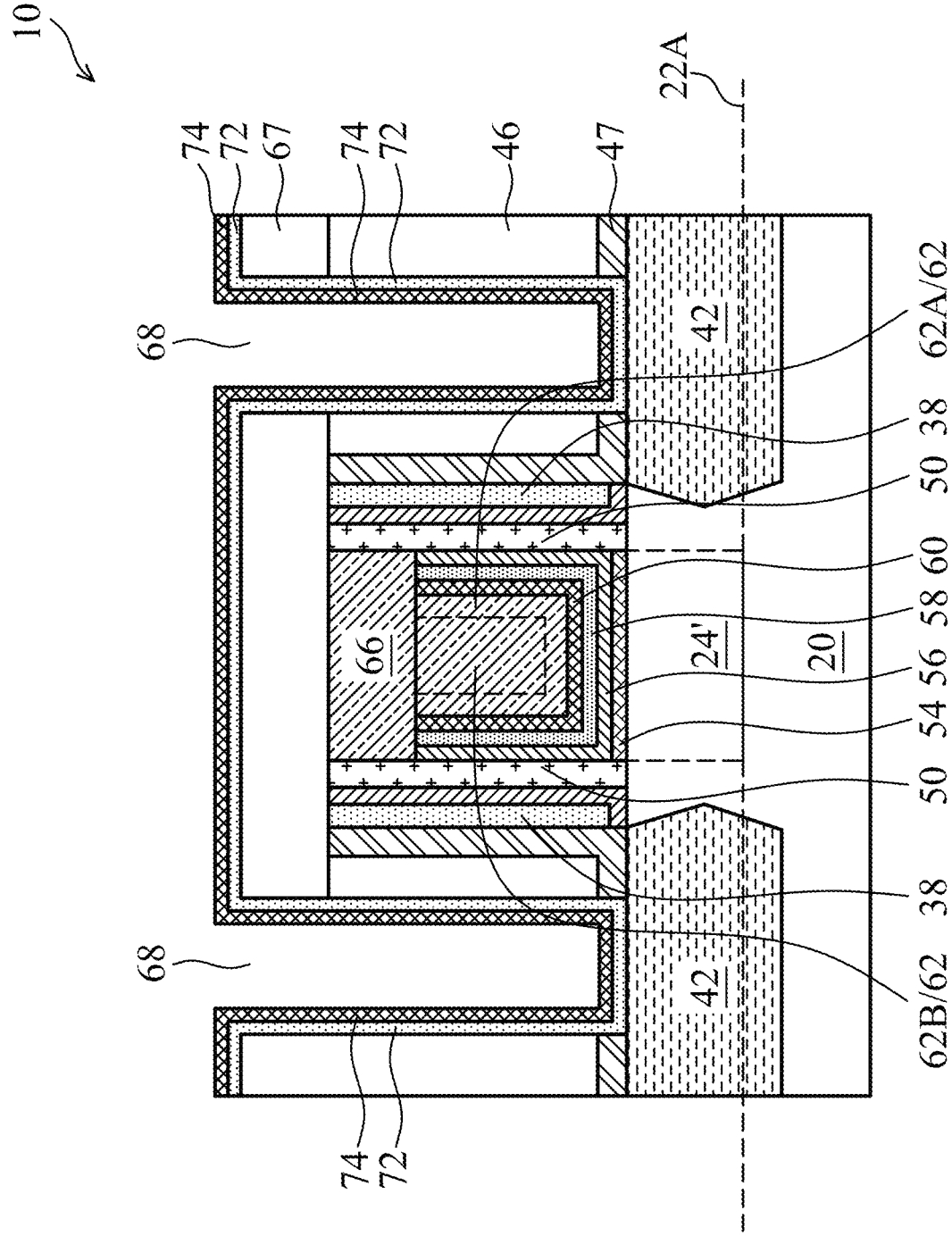
FIGS. 12-22 are cross-sectional views of gate and source/drain contact plugs associated with a transistor, in accordance with some embodiments.
Figure 13:
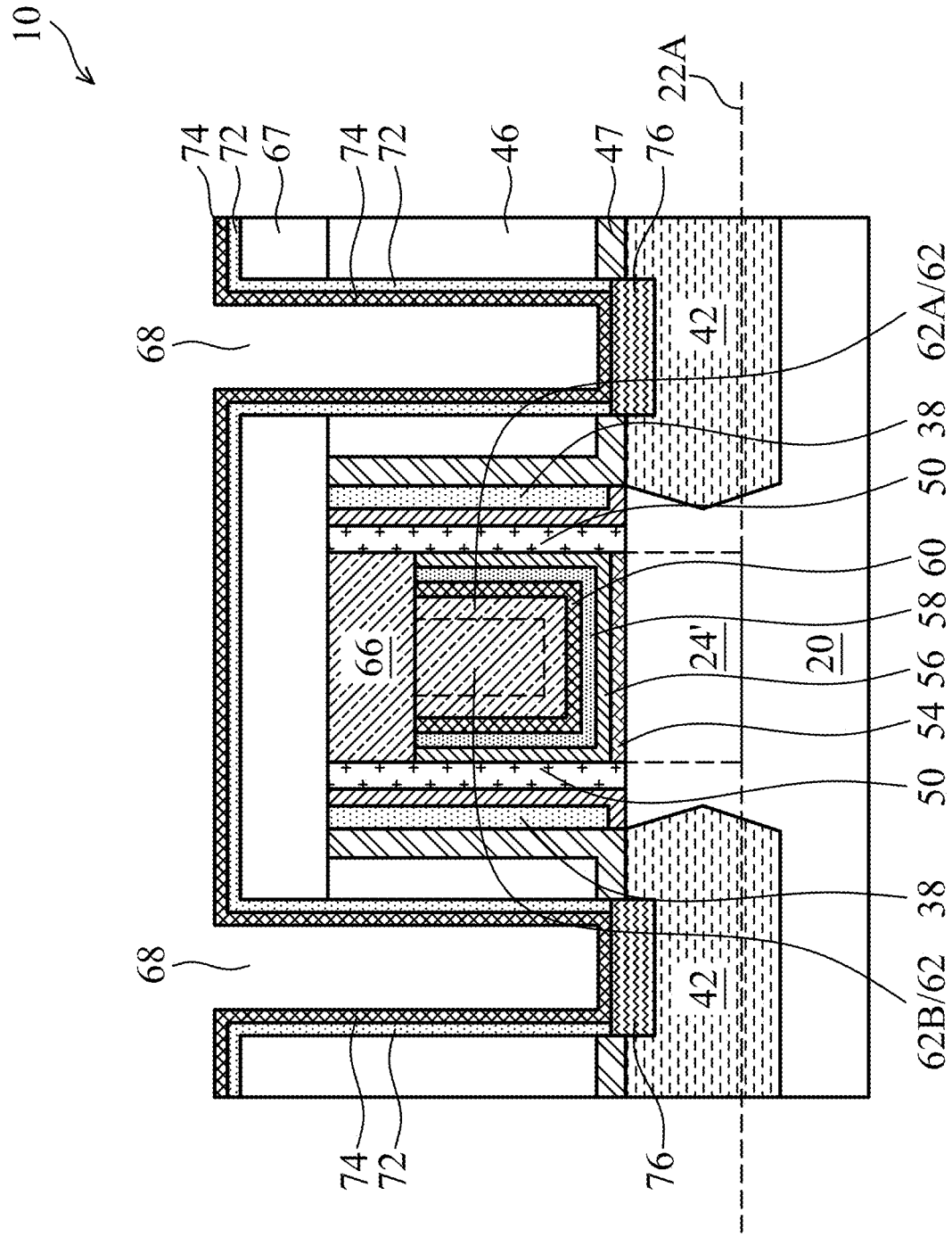
Figure 14:
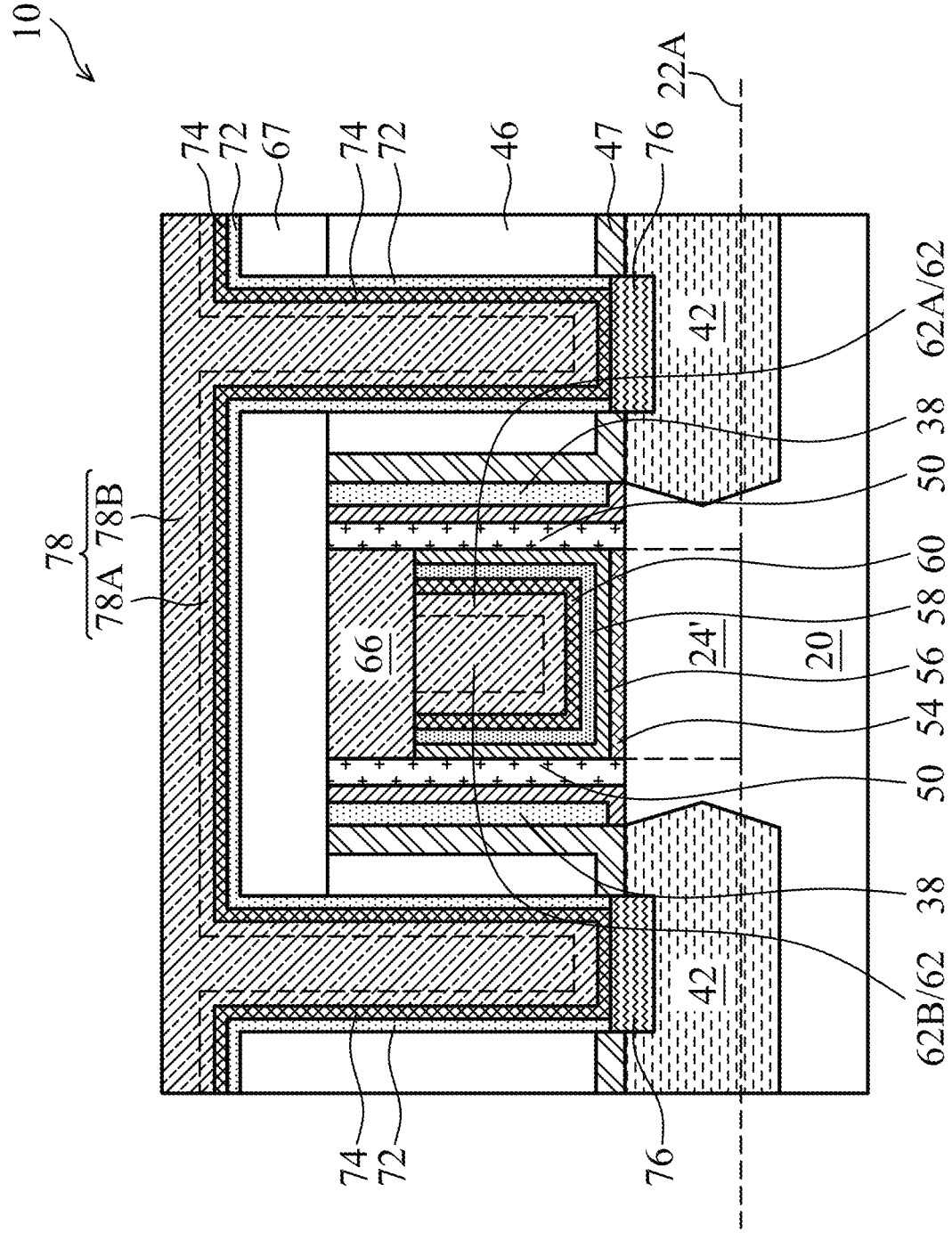

FIGS. 12 through 14 illustrate the formation of lower source/drain contact plugs according to another embodiment. Referring to FIG. 12, dielectric layer 67 is formed over a transistor structure shown including substrate 20, semiconductor fin 24', source/drain regions 42, ILD layer 46, and contact etch stop layer (CESL) 47, followed by the application of a patterned photo resist (not shown). Also shown are a gate structure including metal containing material including layers 62A, 62B and 62, spacers 38/50, interfacial layer 54, high-k dielectric layer 56, diffusion barrier 58, and barrier layer 60. Next, dielectric layer 67, ILD 46, and CESL 47 are etched to form contact openings 68. The respective step is illustrated as step 214 in the process flow shown in FIG. 24. In accordance with some embodiments, metal-containing material 62 includes layer 62A and layer 62B over layer 62A. In accordance with some embodiments, layers 62, 62A, and 62B can comprise tungsten (W), aluminum (Al), titanium (Ti), titanium nitride (TiN), tantalum (Ta), tantalum nitride (TaN), cobalt (Co), copper (Cu), nickel (Ni), combinations thereof, and/or other suitable materials as previously discussed.

Further referring to FIG. 12, metal layer 72 (such as a titanium layer or a tantalum layer) is deposited, for example, using PVD. Barrier layer 74, which may be a metal nitride layer such as a titanium nitride layer or a tantalum nitride layer is then formed over metal layer 72. The respective step is illustrated as step 216 in the process flow shown in FIG. 24. Barrier layer 74 may be formed of using CVD. Layers 72 and 74 are both conformal, and extend into openings 68.

An anneal is then performed to form source/drain silicide regions 76, as shown in FIG. 13. The respective step is illustrated as step 218 in the process flow shown in FIG. 20. The anneal may be performed through Rapid Thermal Anneal (RTA), furnace anneal, or the like. Accordingly, the bottom portion of metal layer 72 reacts with source/drain region 42 to form silicide regions 76.

Next, as shown in FIG. 14, metal-containing layer 78 is deposited over and in contact with barrier layer 74. The respective step is illustrated as step 220 in the process flow shown in FIG. 24. Metal-containing layer 78 may be formed a material selected from the same group of candidate materials of metal-containing material 62. Furthermore, the formation method, the material, and the structure of metal-containing layer 78 may also be selected from the candidate formation methods, the candidate materials, and the candidate structures of metal-containing material 62. For example, metal-containing layer 78 may be a homogenous cobalt layer, a homogeneous tungsten layer, or may include a lower layer 78A and upper layer 78B, wherein the formation methods, the materials, and materials of layers 78A and 78B may be found referring to the above-discussed layers 62A and 62B, respectively, in any combination.

A planarization such as a CMP is then performed to remove the portions of layers 72, 74 and 78 over layer 67. The respective step is illustrated as step 222 in the process flow shown in FIG. 24.

Figure 15:
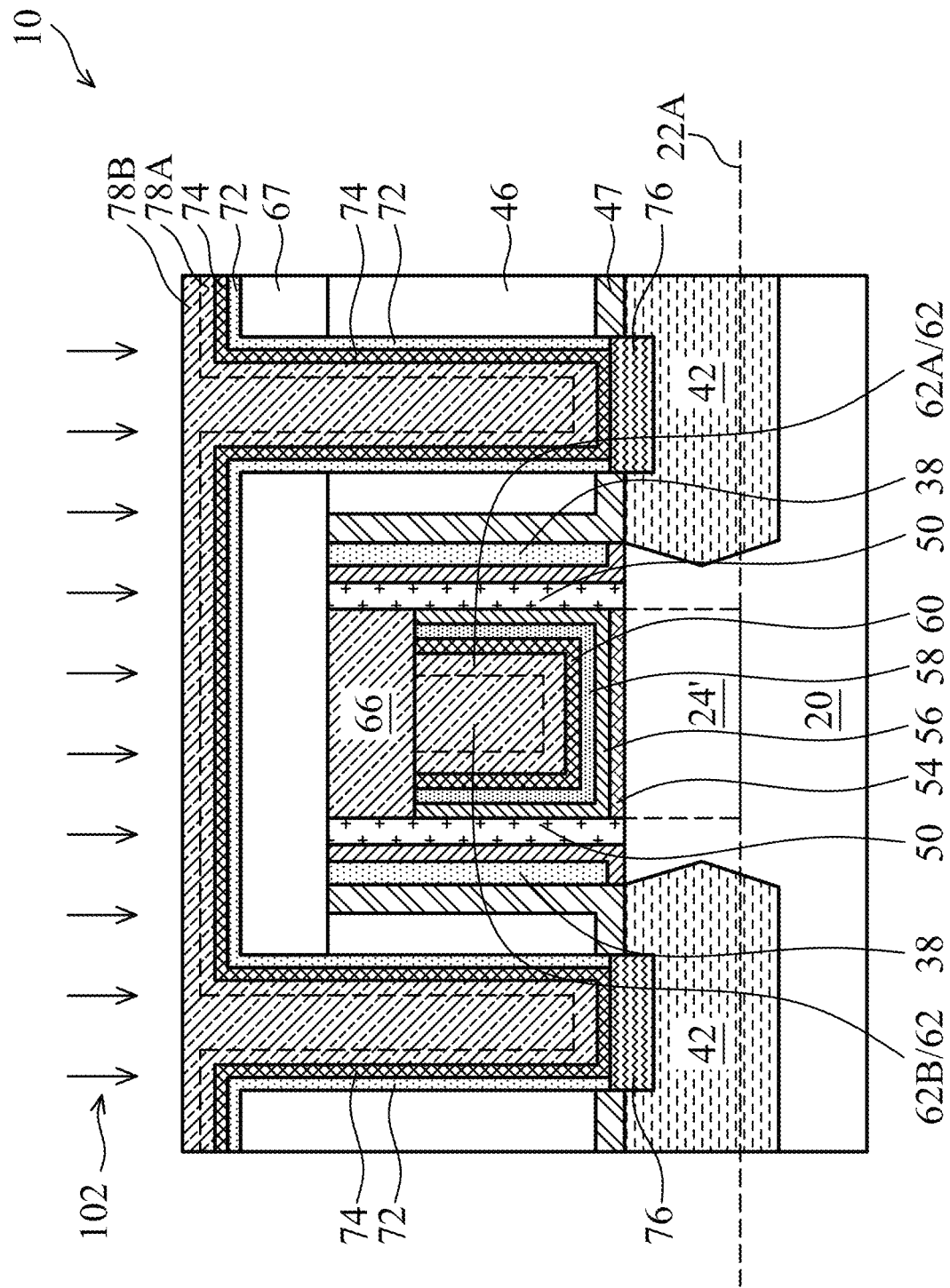

Referring to FIG. 15, the CMP step 102 begins with a partial removal of layer 78B. CMP 102 continues until the entire top portion of metal layers 78A and 78B and all of the portions of the layer 72 and 74 over layer 67 are removed, eventually exposing an upper surface of dielectric layer 67 (best seen in FIG. 16). If metal layers 78A and 78B are formed of cobalt, then a slurry including a cobalt ion source is used in the CMP operation as previously described. If metal layers 78A and 78B are formed of tungsten, then a slurry including a tungsten ion source is used in the CMP operation.

Figure 16:
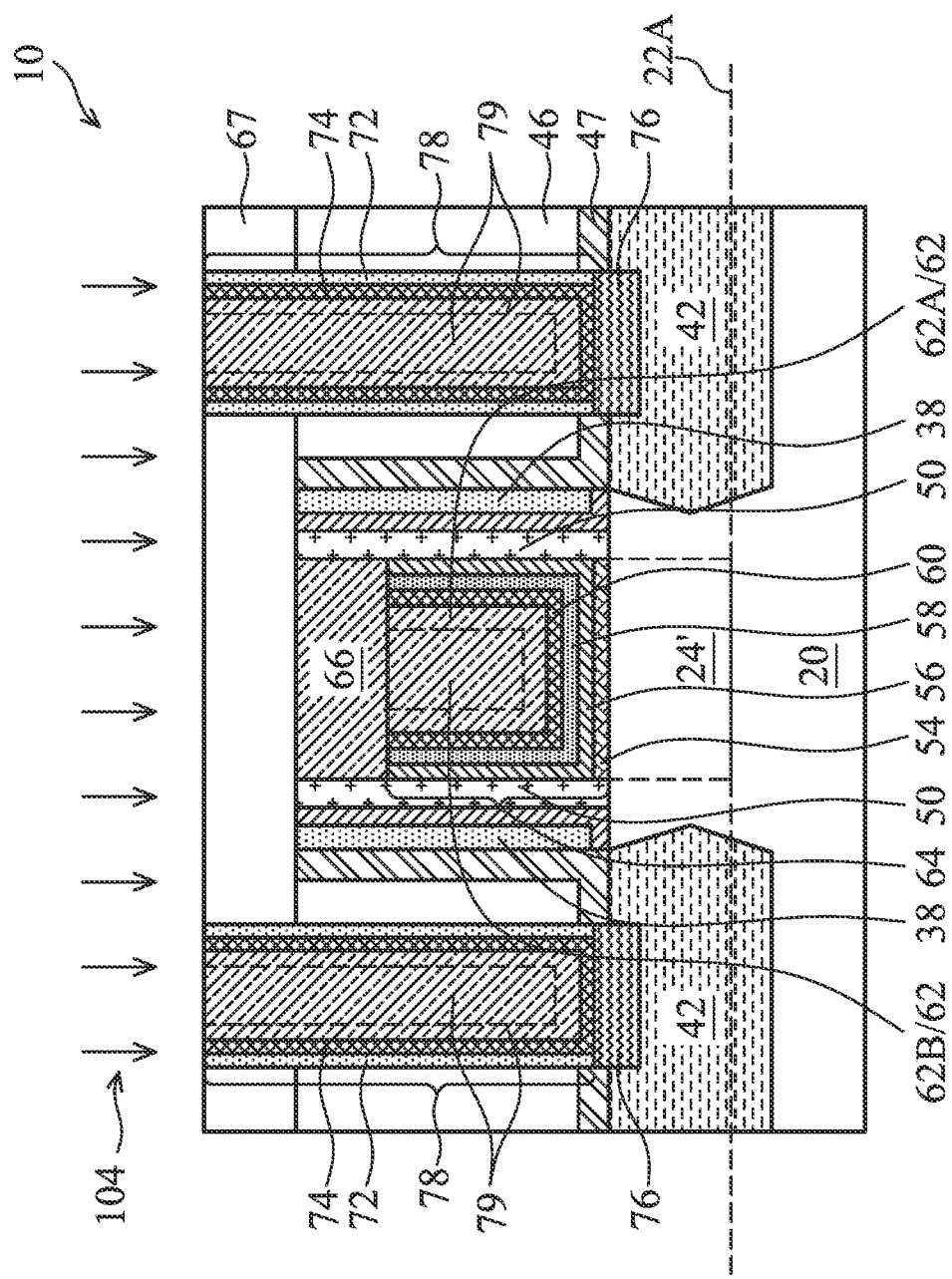

Referring to FIG. 16, a polishing step 104 including a rinse is performed after the CMP step 102 is completed. If metal layers 78 are formed of cobalt, then a rinse including a cobalt ion source is used in the polishing operation as previously described. If metal layers 78 are formed of tungsten, then a rinse including a tungsten ion source is used in the polishing operation.

Figure 17:
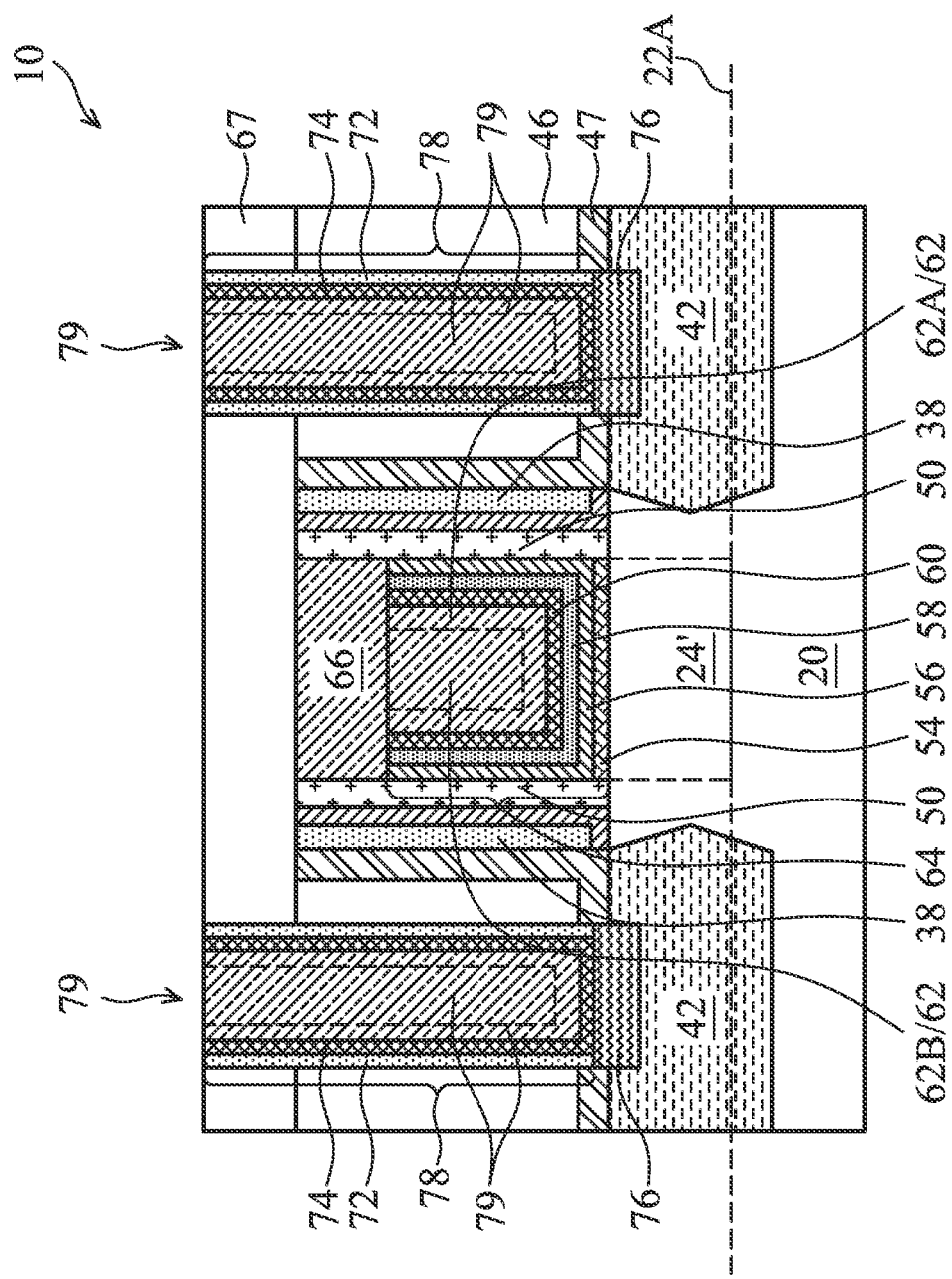

The resulting structure is shown in FIG. 17, which illustrate source/drain contact plugs 79. Each of source/drain contact plugs 79 includes metal-containing layer 78, barrier layer 74, and metal layer 72.

Figure 18:
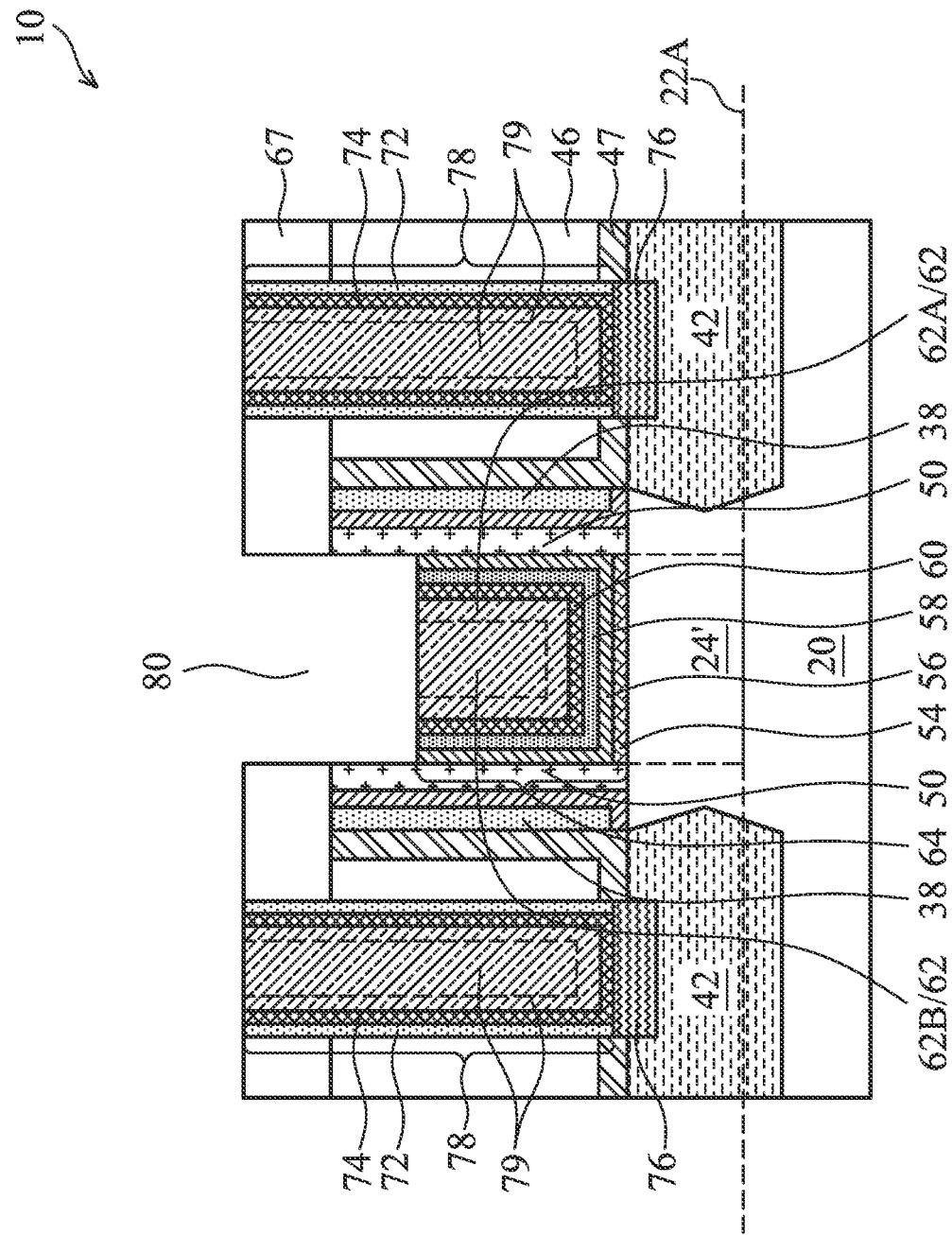

FIGS. 18 through 22 illustrate the formation of a gate contact plug. The respective step is illustrated as step 224 in the process flow shown in FIG. 24. Referring to FIG. 18, a photolithography process is performed using a lithography mask (not shown) to etch-through dielectric layer 67. Hard mask 66 (FIG. 17) is then removed, forming opening 80. In accordance with some embodiments, the formation of opening 80 includes an anisotropic etching to etch-through dielectric layer 67, and an isotropic etching (wet) or an anisotropic etch (dry) to remove hard mask 66.

Figure 19:
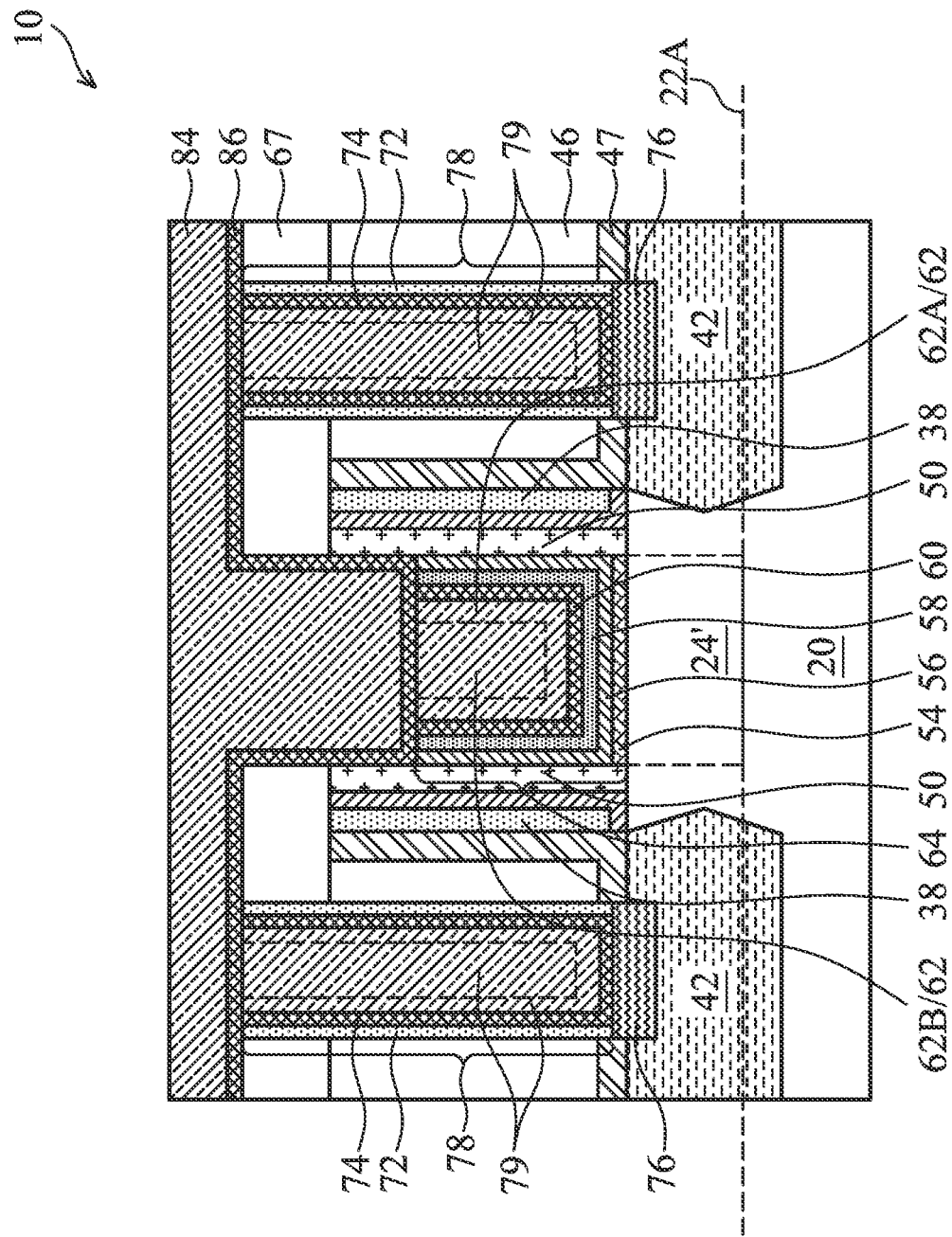

Referring to FIG. 19, barrier layer 86 and metal-containing material 84 are deposited. Barrier layer 86 may be formed of titanium nitride or tantalum nitride.

The material, the structure, and the formation method of metal-containing material 84 may be selected from the candidate materials, the candidate structures, and the candidate formation methods, respectively, of metal-containing material 62, and hence the details are not repeated herein, and may be found referring to the discussion of metal-containing material 62. Accordingly, similar to metal-containing material 62, metal-containing material 84 may also be formed of tungsten, cobalt, or composite layers thereof. In a subsequent step, a planarization such as a CMP is performed. The planarization may be performed until all of layer 67 is removed, and ILD 46 is exposed. Accordingly, layer 67 acts as a sacrificial layer.

Figure 20:
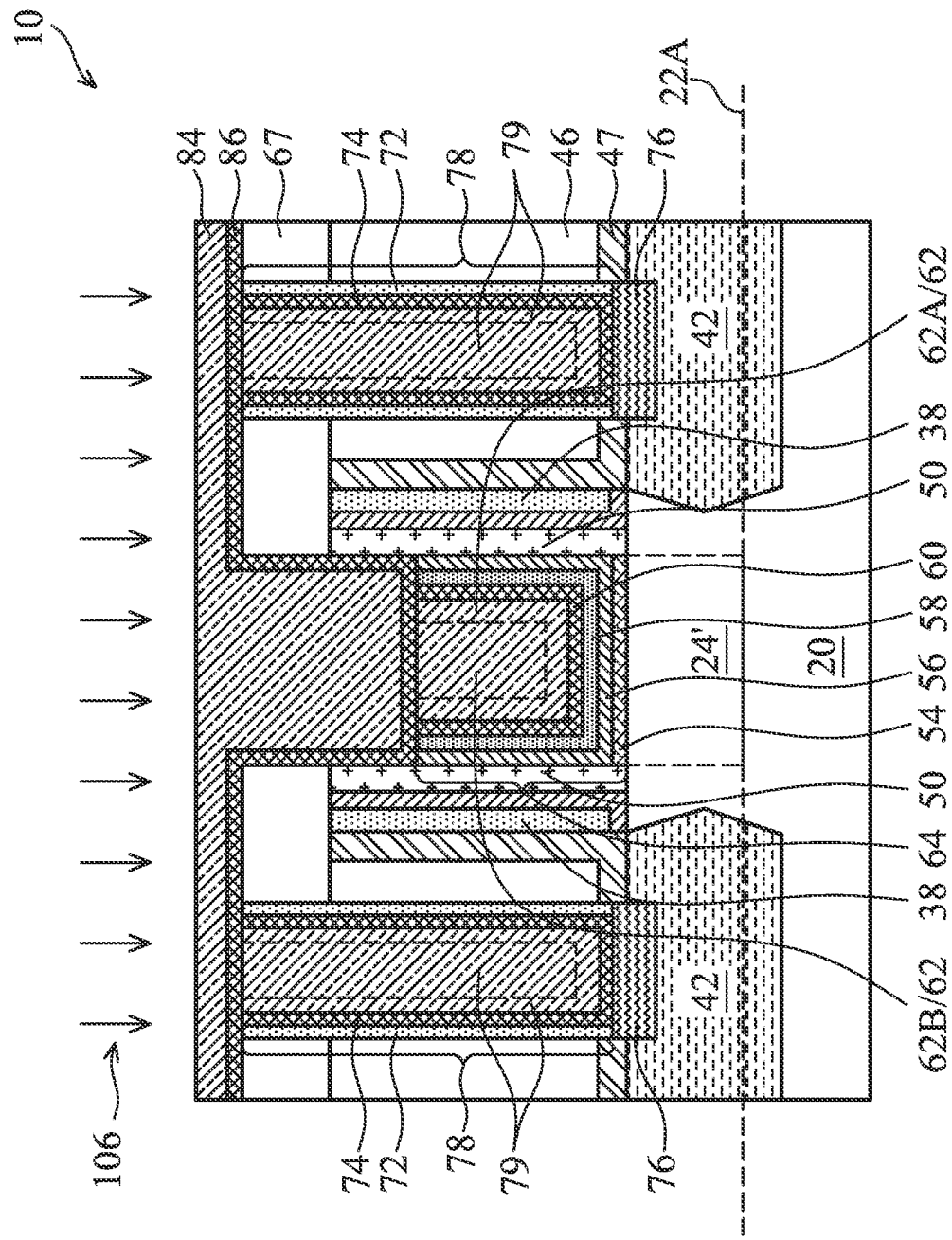

Referring to FIG. 20, the CMP step 106 begins with a partial removal of layer 84. CMP 106 continues until eventually the entire top portion of metal layers 84 and 86 are removed, exposing an upper surface of dielectric layer 46 (best seen in FIG. 21). If metal layer 84 is formed of cobalt, then a slurry including a cobalt ion source is used in the CMP operation as previously described. If metal layer 84 is formed of tungsten, then a slurry including a tungsten ion source is used in the CMP operation.

Figure 21:
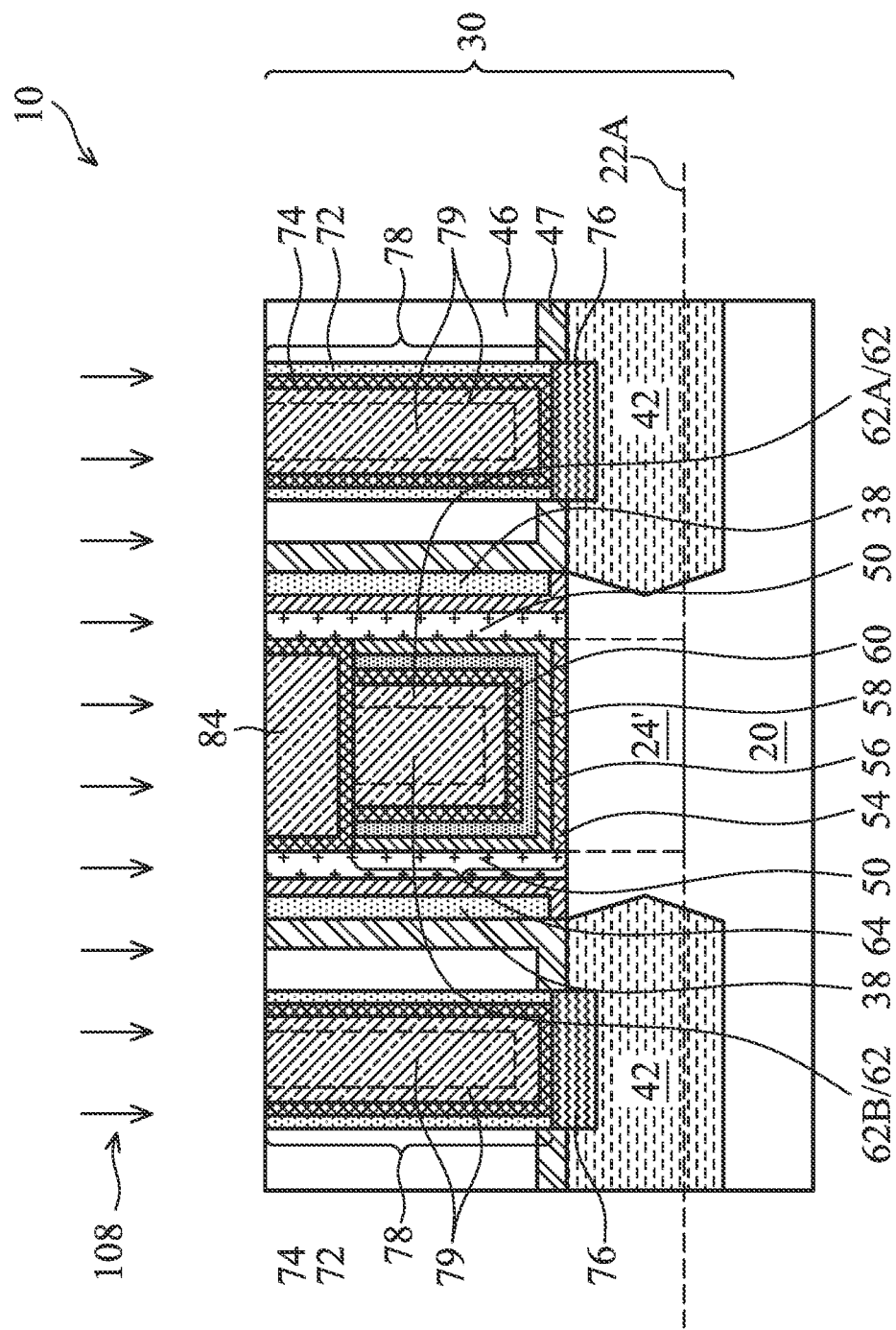

Referring to FIG. 21, a polishing step 108 including a rinse is performed after the CMP step 106 is completed. If metal layer 84 is formed of cobalt, then a rinse including a cobalt ion source is used in the polishing operation as previously described. If metal layers 84 are formed of tungsten, then a rinse including a tungsten ion source is used in the polishing operation.

Figure 22:
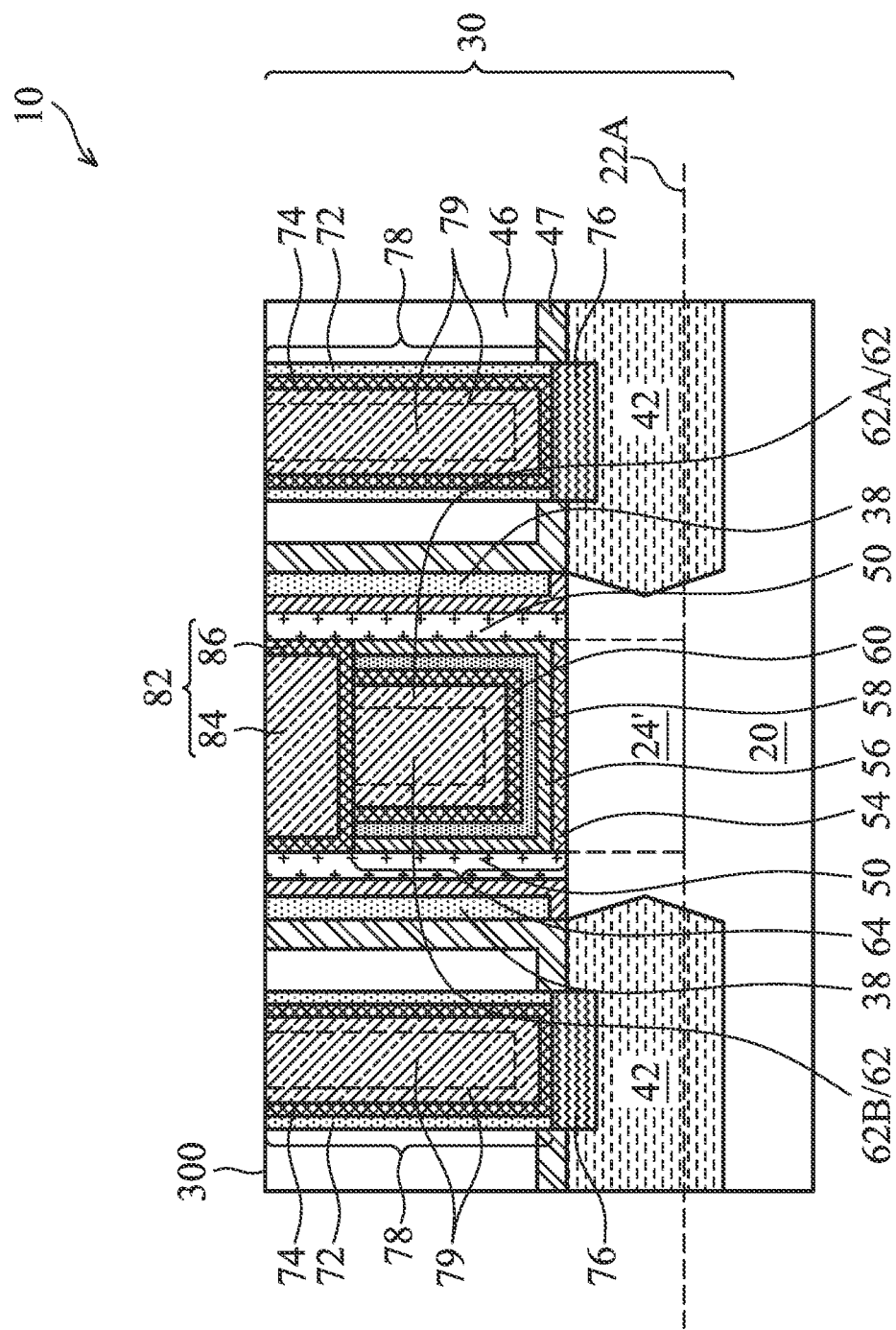

The resulting structure is shown in FIG. 22, which illustrates contact plug 82 formed of the remaining portions of layers 84 and 86. Transistor or FinFET 300 is thus formed using a gate contact plug and source/drain contact plugs according to embodiments.

Figure 23:
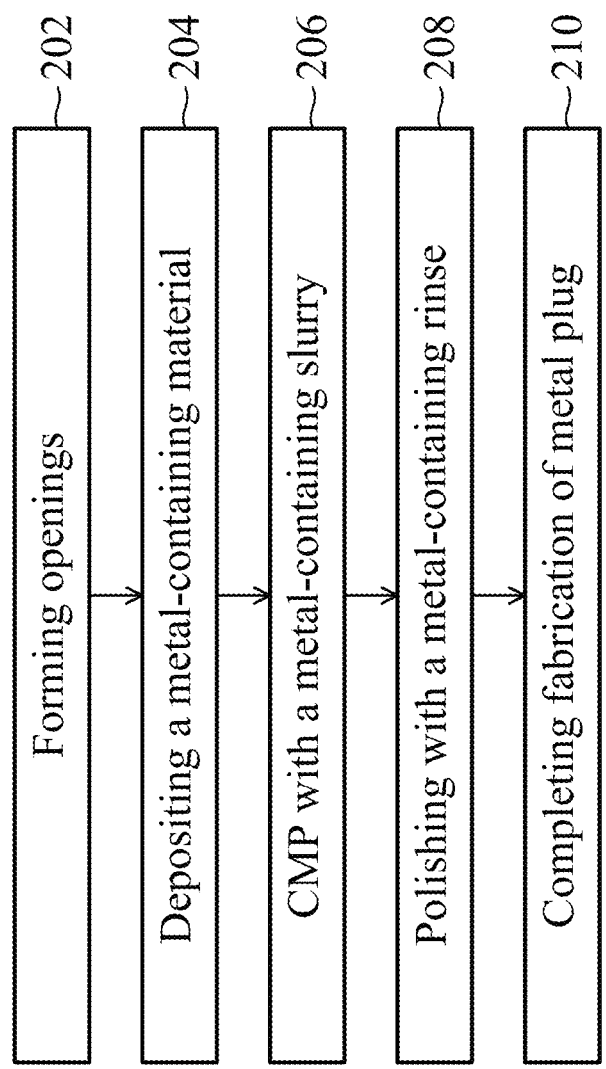
FIGS. 23-24 are process flow diagrams for forming gate and source/drain contact plugs associated with a transistor, in accordance with some embodiments.
Figure 24:
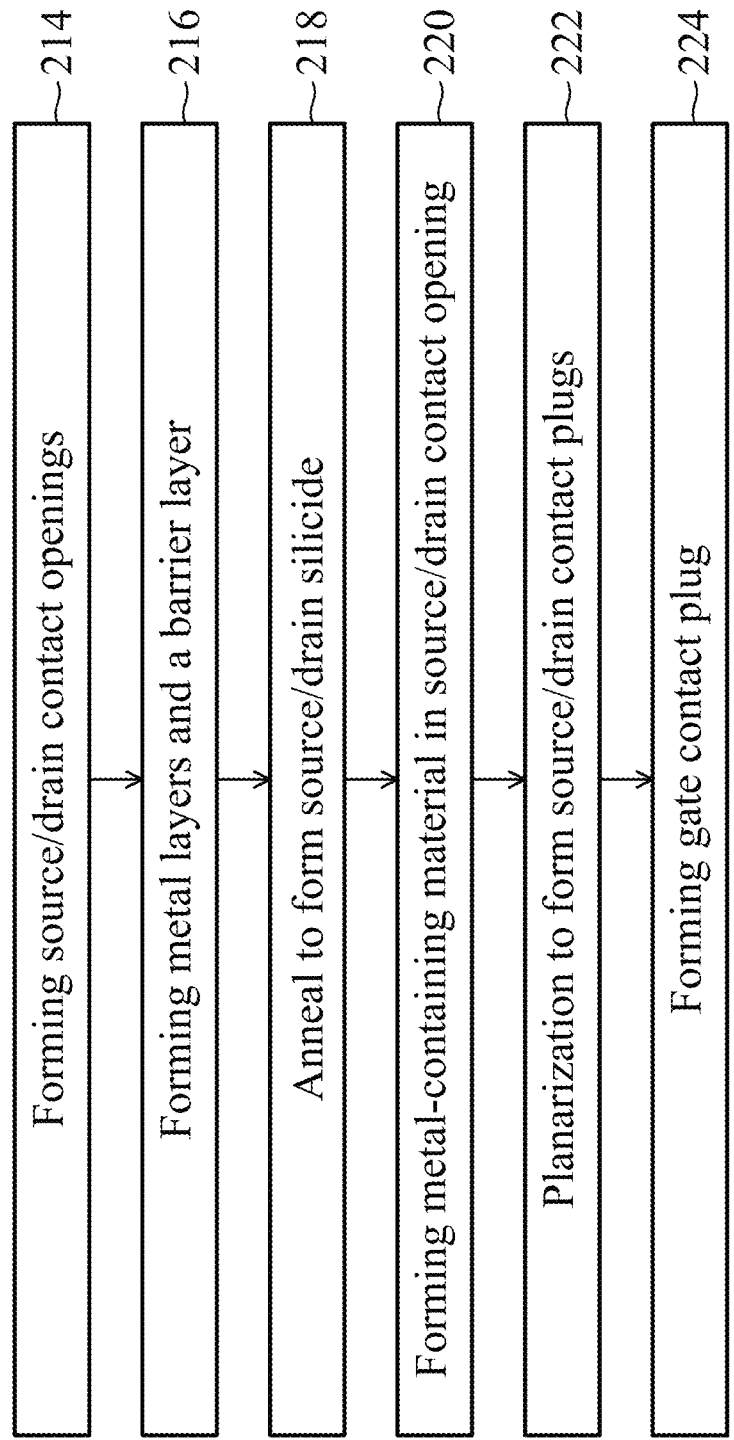

FIG. 23 is a process flow that illustrates the process steps 220, 222, and 224 of the process flow of FIG. 24 in further detail. For either of the source/drain contact plugs, or the gate contact plug, or even a contact plug not associated with a transistor, the process flow of FIG. 23 illustrates several intermediate steps associated with forming the contact plug according to an embodiment. A first intermediate step 202 forms an opening, for example by etching an opening in a dielectric layer to expose a conductive layer or region. A second intermediate step 204 deposits a metal-containing material such as, for example, tungsten or cobalt. A third intermediate step 206 performs CMP with a metal-containing slurry having a metal ion source of the same type as the deposited metal-containing material. In an embodiment, a cobalt-containing slurry will be used with a cobalt contact plug, and a tungsten-containing slurry will be used with a tungsten contact plug. A fourth intermediate step 208 performs a polishing step once the CMP step is completed. A rinse associated with the polishing step includes a metal ion source. For example, a cobalt-containing rinse will be used with a cobalt contact plug, and a tungsten-containing rinse will be used with a tungsten contact plug. At a fifth intermediate step 210 the polishing and rinse steps are completed and the metal contact plug is formed substantially without corrosion.

FIG. 24 shows the process steps associated with forming source/drain and gate contacts plugs for a partially-completed transistor, such as a FinFET, according to an embodiment. At step 214, source/drain contact openings are formed in the partially completed transistor. At step 216, metal layers and a barrier layer are formed in the source/drain openings. At step 218, the transistor is annealed to form source/drain silicide regions. At step 220, metal-containing material, such as cobalt or tungsten, is formed in the source/drain contact openings. At step 222 planarization using a metal-containing slurry in a CMP operation is used according to an embodiment, wherein the source of metal ions in the slurry is of the same type as the metal used in the source/drain contacts plugs. At step 222, the planarization also includes a fine polishing step using a metal-containing rinse according to an embodiment, wherein the source of metal ions in the rinse is of the same type as the metal used in the source/drain contact plugs. At step 224, the gate contact plugs are formed, using a planarization operation substantially the same as that described above with respect to forming the source/drain contact plugs.

According to embodiments, corrosion of metal contact plugs is substantially diminished during planarization, even at feature sizes of 16 nm through the use of a metal ion source added to a CMP slurry and/or a fine polishing rinse.

Figure 25:
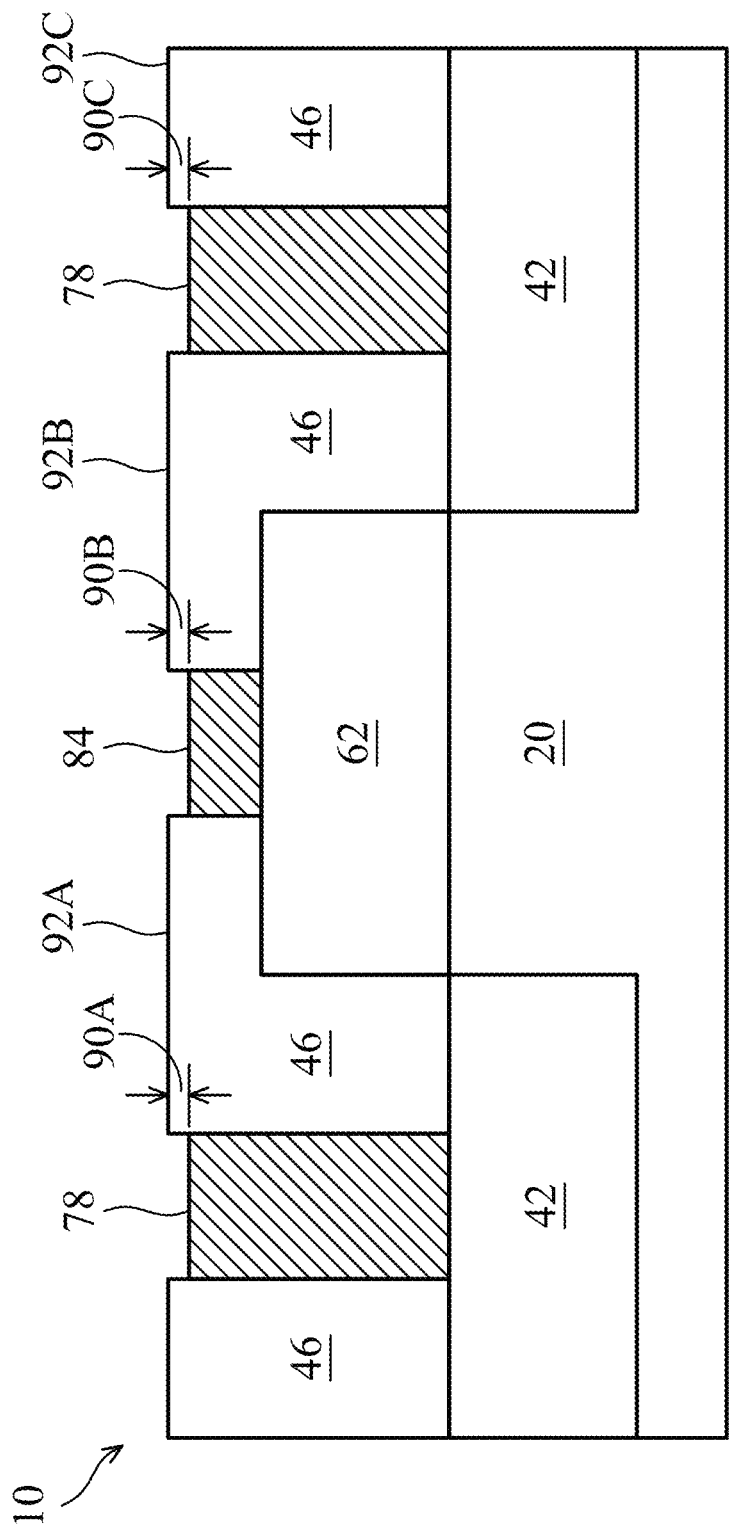

Using a source of cobalt or tungsten ions in a slurry during a CMP operation, or in a rinse solution during or associated with a polishing operation can minimize the metal recess or corrosion of a contact plug to a depth of less than 2 nm (measured from the top of the contact plug as is shown in FIG. 25). In an embodiment, FIG. 25 shows a first source/drain contact plug 78 having a top surface recessed less than a depth 90A of less than 2 nm measured from a top surface 92A of ILD layer 46. A gate contact plug 84 has a top surface recessed less than a depth 90B of less than 2 nm measured from a top surface 92B of adjacent layer 46. A second source/drain contact plug 78 has a top surface recessed less than a depth 90C of less than 2 nm measured from a top surface 92C of adjacent layer 46. Further, using a source of cobalt or tungsten ions in the slurry or rinse solution allows for a CMP operation with a high cobalt or tungsten removal rate of greater than 30 nm/minute in the CMP operation while avoiding cobalt or tungsten recesses or corrosion. Still further, using a source of cobalt or tungsten ions in the slurry or rinse solution can avoid the detrimental side effects of using organic recess or corrosion inhibitors, such as organic residues or particle issues associated with the inhibitor chemicals. According to embodiments, the static etch rate of a contact plug can be reduced to 2.5 Angstroms per minute.

The problem of plug corrosion addressed by embodiments discussed herein is even more pronounced in isolated plug regions (lower plug density) than in dense plug regions (higher plug density) due to a lower ion concentration on the surface of the contact plug during CMP processing. The areas of lowest plug density will incur the maximum recess and/or corrosion measured from a top surface of the corresponding plug to the top surface of an immediately adjacent device region. The rate determinate step in anodic oxidation (corrosion) resulting in the surface recess of a tungsten plug for a solution having a pH of between 2 and 4, such as 2.6, for example, is given by the following equation:

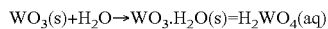

$$WO_3(s) + H_2O \rightarrow WO_3 \cdot H_2O(s) = H_2WO_4(aq)$$

wherein $WO_3(s)$, which represents tungsten oxide on the plug combines with water to form $WO_3$ $H_2O(s)$, which represents the reactant of corrosion, and yields $H_2WO_4(aq)$, which represents the tungsten ion. Particular embodiments address the loss of tungsten in the contact plug during CMP by supplying an additional source of tungsten ions during CMP processing, thereby shifting the equilibrium of this chemical reaction back towards the reactants and slowing down the reaction rate. The above description is substantially similar for a cobalt contact plug and supplying an additional source of cobalt ions during CMP processing.

Figure 26:
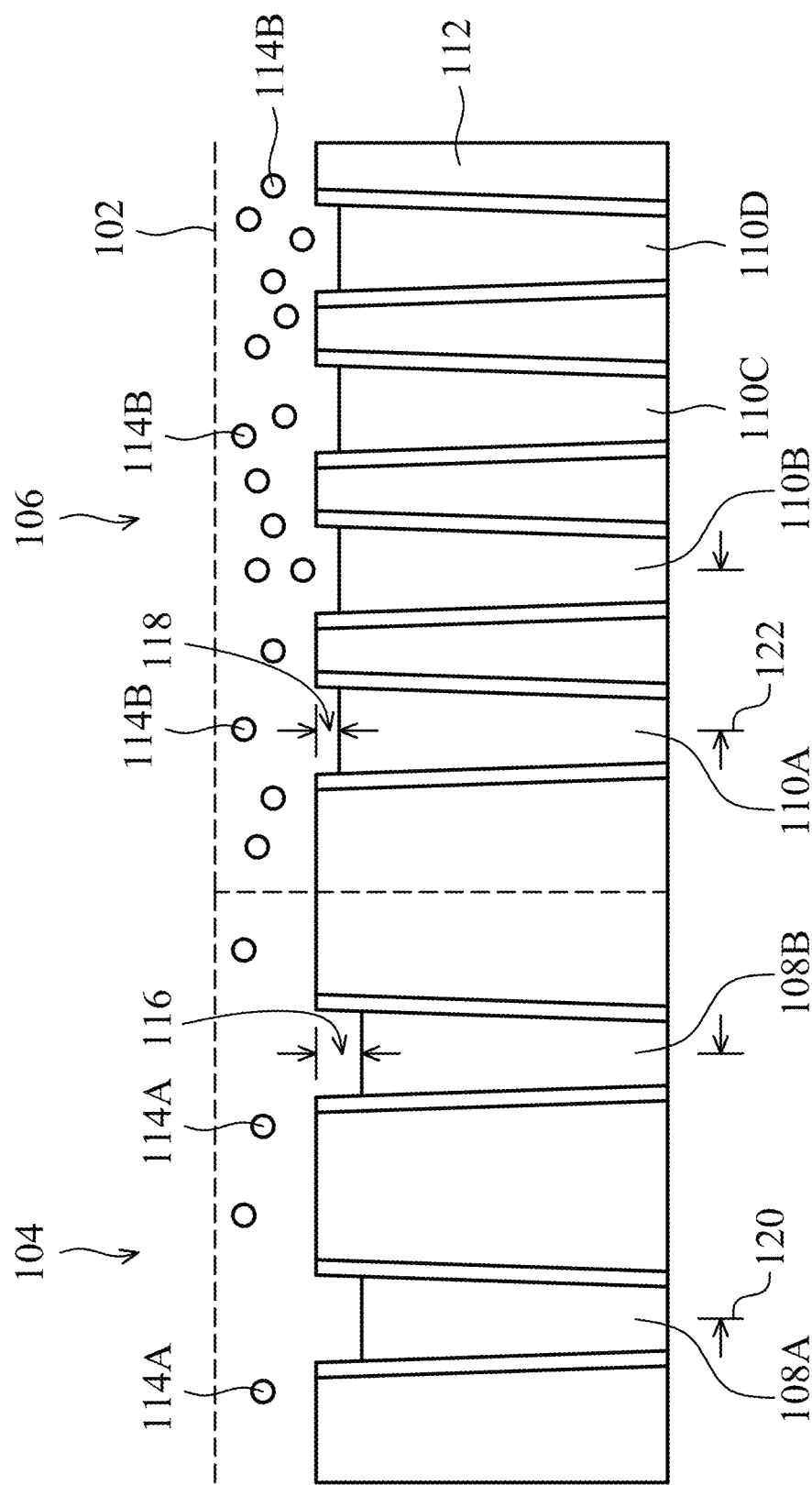
FIG. 26 is a cross-sectional view of contact plugs in isolated and dense areas, according with some embodiments.

Isolated plug regions and dense plug regions are described in further detail with reference to a cross-sectional view of a device portion (not necessarily associated with a transistor) in FIG. 26. FIG. 26 illustrates contact plugs 108A and 108B located in an isolated plug region 264 and contact plugs 110A, 110B, 110C, and 110D located in a dense plug region 266. A pitch 120 between adjacent contact plugs 108A and 108B of the isolated plug region 264 is 1.0 μm in an embodiment, with a range of 0.6 μm to 30 μm. A pitch 122 between adjacent contact plugs 110A and 110B of the dense plug region 266 is 50 nm in an embodiment, with a range of 20 nm to 100 nm. The contact plugs are formed in a representative dielectric region 112 such as an ILD layer, in an embodiment. Additional layers connecting to the bottom of the contact plugs are not shown in FIG. 26. The contact plugs can be formed of either cobalt or tungsten, in an embodiment. A diffusion layer 262 including metal ions in solution is shown that is present either during CMP processing or subsequent polishing and rinsing steps. In the isolated region 264 there are relatively fewer metal ions 114A in solution from contact plugs 108A and 108B, and in the dense region 266 there are relatively more metal ions 114B in solution from contact plugs 110A, 110B, 110C, and 110D. In an embodiment, the contact plugs are tungsten contact plugs, and the metal ions are $WO_4^{2-}$ metal ions. In another embodiment, the contact plugs are cobalt contact plugs, and the metal ions are $Co2+$ metal ions. Contact plug recesses 116 can attain a maximum recess of 50 Angstroms in the isolated plug region 264, with a range of zero Angstroms to 100 Angstroms. Contact plug recesses 118 can attain a minimum recess of zero Angstroms in the dense plug region 266, with a range of zero Angstroms to 20 Angstroms. Thus, the difference between the maximum contact plug recess 116 in the isolated plug region 264 and the minimum contact plug recess 118 in the dense plug region 266 is about 100 Angstroms, with a range of zero Angstroms to 100 Angstroms. Note that introducing additional metal ions to diffusion layer 262 according to an embodiment ensures that the maximum recess 116 and the minimum recess 118 are both maintained within a recess depth limit of 2 nm, as is described above.

A method of forming a transistor comprising includes forming a gate dielectric on a semiconductor region, forming a gate electrode over the gate dielectric, forming a source/drain region extending into the semiconductor region, forming a source/drain contact plug over and electrically coupling the source/drain contact plug to the source/drain region, forming a gate contact plug over and electrically coupling the gate contact plug to the gate electrode, and exposing at least one of the source/drain contact plug or the gate contact plug to a metal ion source solution, wherein a constituent metal of a metal ion in the metal ion source solution and the at least one contact plug is the same.

If a cobalt contact plug is used, the metal ion source solution includes a cobalt ion source solution, and if a tungsten contact plug is used, the metal ion source solution includes a tungsten ion source solution. Forming the source/drain contact plug or the gate contact plug includes a CMP planarization operation, which includes the use of a slurry. The slurry for a cobalt contact plug includes cobalt acetate $(Co(OAc)_2)$, cobalt hydroxide $(Co(OH)_2)$, cobalt chloride $(CoCl_2)$, or hexamine cobalt chloride $([Co(NH_3)_6]Cl_3)$. The slurry for a tungsten contact plug includes tungsten chloride $(WCl_4)$, tungsten hexachloride $(WCl_6)$, tungstic acid $(H_2WO_4)$, or tungsten oxychloride $(WOCl_4)$. The planarization operation can include an additional polishing operation. A rinse used in conjunction with the additional polishing operation of a cobalt contact plug can include cobalt acetate $(Co(OAc)_2)$, cobalt hydroxide $(Co(OH)_2)$, cobalt chloride $(CoCl_2)$, or hexamine cobalt chloride $([Co(NH_3)_6]Cl_3)$. A rinse used in conjunction with the additional polishing operation of a tungsten contact plug can include tungsten chloride $(WCl_4)$, tungsten hexachloride $(WCl_6)$, tungstic acid $(H_2WO_4)$, or tungsten oxychloride $(WOCl_4)$.

A concentration of the metal ion in the metal ion source solution is between 10 ppm and a saturated solution concentration. A metal recess of at least one of the source/drain contact plug or the gate contact plug is minimized to a depth of less than two nm measured from the top of the contact plug while maintaining a CMP removal rate of greater than 30 nm/minute during the formation of the contact plug. A pH of the metal ion source solution is between 2 and 4 for tungsten.

A method includes forming a first region, forming a contact plug over and electrically coupling the contact plug to the first region, and exposing the contact plug or the gate contact plug to a metal ion source solution, wherein a constituent metal of a metal ion in the metal ion source solution and the contact plug is the same. If a cobalt contact plug is used, the metal ion source solution comprises a cobalt ion source solution. If a tungsten contact plug is used, the metal ion source solution comprises a Tungsten ion source solution. Forming the contact plug can include a CMP operation. A slurry used in the CMP operation can include cobalt acetate ($Co(OAc)_2$), cobalt hydroxide ($Co(OH)_2$), cobalt chloride ($CoCl_2$), or hexamine cobalt chloride ($[Co(NH_3)_6]Cl_3$), tungsten chloride ($WCl_4$), tungsten hexachloride ($WCl_6$), tungstic acid ($H_2WO_4$), or tungsten oxychloride ($WOCl_4$). The planarization operation can include an additional polishing operation. A rinse used in conjunction with the additional polishing operation of a cobalt contact plug can include cobalt acetate ($Co(OAc)_2$), cobalt hydroxide ($Co(OH)_2$), cobalt chloride ($CoCl_2$), or hexamine cobalt chloride ($[Co(NH_3)_6]Cl_3$). A rinse used in conjunction with the additional polishing operation of a tungsten contact plug can include tungsten chloride ($WCl_4$), tungsten hexachloride ($WCl_6$), tungstic acid ($H_2WO_4$), or tungsten oxychloride ($WOCl_4$).

A method of manufacturing a device includes exposing at least one of a source/drain contact plug or a gate contact plug to a metal ion source solution during a manufacturing process, wherein a constituent metal of a metal ion in the metal ion source solution and the at least one source/drain contact plug or gate contact plug is the same. If the source/drain contact plug or the gate contact plug is formed of cobalt, the metal ion source solution includes a cobalt ion source solution. If the source/drain contact plug or the gate contact plug is formed of tungsten, the metal ion source solution includes a tungsten ion source solution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a substrate, the dielectric layer having a recess;
   forming a conductive layer over the dielectric layer, the conductive layer filling the recess;
   planarizing the conductive layer using a CMP operation to form a conductive feature in the dielectric layer, the CMP operation having a CMP removal rate of the conductive layer greater than 30 nm/minute; and
   during the CMP operation, exposing the conductive layer to a metal ion source solution, wherein a constituent metal of a metal ion in the metal ion source solution and a constituent metal of the conductive layer are the same, and wherein after the CMP operation an upper surface of the conductive feature is recessed from an upper surface of the dielectric layer by a depth of less than two nm.

2. The method of claim 1, wherein the conductive layer comprises cobalt, and the metal ion source solution comprises a cobalt ion source solution, wherein the metal ion in the metal ion source solution reduces an anodic oxidation reaction rate of the conductive feature and the constituent metal in the conductive layer being a reactant of a reaction with the metal ion source solution, and the metal ion in the metal ion source solution shifting an equilibrium of the reaction towards the reactants.

3. The method of claim 1, wherein the conductive layer comprises tungsten, and the metal ion source solution comprises a tungsten ion source solution.

4. The method of claim 1, wherein a slurry used in the CMP operation comprises one of Co(OAc)2, Co(OH)2, CoCl2, [Co(NH3)6]Cl3, WCl4, WCl6, H2WO4, or WOCl4.

5. The method of claim 1 further comprising an additional polishing operation.

6. The method of claim 5, wherein a rinse used in conjunction with the additional polishing operation comprises one of Co(OAc)2, Co(OH)2, CoCl2, [Co(NH3)6]Cl3, WCl4, WCl6, H2WO4, or WOCl4.

7. The method of claim 1, wherein a concentration of a metal ion source compound in the metal ion source solution is between 10 ppm and a saturated solution concentration.

8. The method of claim 1, wherein a pH of the metal ion source solution is between 2 and 4 for a tungsten ion source solution.

9. The method of claim 1, wherein a pH of the metal ion source solution greater than 9 for a cobalt ion source solution.

10. A method comprising:
    forming a dielectric layer, the dielectric layer having a recess;
    forming a conductive layer in the recess;
    performing a CMP operation on the conductive layer to form a conductive feature; and
    exposing the conductive layer to a metal ion source solution during the CMP operation, wherein a constituent metal of a metal ion in the metal ion source solution and a constituent metal of the conductive layer are the same, and wherein the metal ion in the metal ion source solution reduces an anodic oxidation reaction rate of the conductive feature.

11. The method of claim 10, wherein forming the conductive feature comprises forming a cobalt conductive feature, and the metal ion source solution comprises a cobalt ion source solution, the CMP operation having a CMP removal rate of the conductive layer greater than 30 nm/minute, wherein after the CMP operation an upper surface of the conductive feature is recessed from an upper surface of the dielectric layer by a depth of less than two nm, the constituent metal in the conductive layer being a reactant of a reaction with the metal ion source solution, and the metal ion in the metal ion source solution shifting an equilibrium of the reaction towards the reactants.

12. The method of claim 10, wherein forming the conductive feature comprises forming a tungsten conductive feature, and the metal ion source solution comprises a tungsten ion source solution.

13. The method of claim 10, wherein a slurry used in the CMP operation comprises one of Co(OAc)2, Co(OH)2, CoCl2, [Co(NH3)6]Cl3, WCl4, WCl6, H2WO4, or WOCl4.

14. The method of claim 10 further comprising an additional polishing operation.

15. The method of claim 14, wherein a rinse used in conjunction with the additional polishing operation comprises one of Co(OAc)2, Co(OH)2, CoCl2, [Co(NH3)6]Cl3, WCl4, WCl6, H2WO4, or WOCl4.

16. A method of manufacturing a device comprising:
depositing a conductive layer;
performing a planarization process on the conductive layer; and
exposing the conductive layer to a metal ion source solution during the planarization process, wherein a constituent metal of a metal ion in the metal ion source solution and the conductive layer is the same, the constituent metal in the conductive layer being a reactant of a reaction with the metal ion source solution, and the metal ion in the metal ion source solution shifting an equilibrium of the reaction towards the reactants.

17. The method of claim 16, wherein the conductive layer comprises cobalt, and wherein the metal ion source solution comprises a cobalt ion source solution, the planarization process having a removal rate of the conductive layer greater than 30 nm/minute, wherein after the planarization process an upper surface of the conductive layer is recessed from an upper surface of a dielectric layer by a depth of less than two nm, and wherein the metal ion in the metal ion source solution reduces an anodic oxidation reaction rate of the conductive layer.

18. The method of claim 16, wherein the conductive layer comprises tungsten, and wherein the metal ion source solution comprises a tungsten ion source solution.

19. The method of claim 16, wherein the metal ion source solution comprises at least one of a slurry or a rinse used in the planarization process.

20. The method of claim 16, wherein a slurry including an inhibitor and the metal ion source solution is used in the planarization process, and wherein a static etch rate of the conductive layer exposed to the slurry is 2.5 Angstroms per minute.

* * * * *